(12) United States Patent
You et al.

(10) Patent No.: US 12,321,095 B2
(45) Date of Patent: Jun. 3, 2025

(54) MICROCAPSULE IMAGING SYSTEM INCLUDING NON-PHOTOPOLYMERIZABLE REACTIVE DILUENT

(71) Applicant: Polaroid IP B.V., Enschede (NL)

(72) Inventors: Wei You, Taichung (TW); Chun-Jen Chen, New Taipei (TW); Rong-Chang Liang, Cupertino, CA (US)

(73) Assignee: Polaroid IP B.V., Enschede (NL)

( * ) Notice: Subject to any disclaimer, the term of this patent is extended or adjusted under 35 U.S.C. 154(b) by 128 days.

(21) Appl. No.: 17/833,731

(22) Filed: Jun. 6, 2022

(65) Prior Publication Data

US 2023/0393459 A1     Dec. 7, 2023

(51) Int. Cl.
| | | |
|---|---|---|
| G03F 7/00 | (2006.01) | |
| G03F 7/038 | (2006.01) | |
| G03F 7/105 | (2006.01) | |
| G03F 7/32 | (2006.01) | |

(52) U.S. Cl.
CPC ............ *G03F 7/002* (2013.01); *G03F 7/0385* (2013.01); *G03F 7/105* (2013.01); *G03F 7/32* (2013.01)

(58) Field of Classification Search
None
See application file for complete search history.

(56) References Cited

U.S. PATENT DOCUMENTS

| | | | | |
|---|---|---|---|---|
| 4,399,209 A | * | 8/1983 | Sanders | ............ G03F 7/002 430/211 |
| 4,416,966 A | | 11/1983 | Sanders et al. | |
| 4,440,846 A | | 4/1984 | Sanders et al. | |
| 4,532,200 A | | 7/1985 | Arney et al. | |
| 4,536,463 A | | 8/1985 | Sanders | |
| 4,766,050 A | | 8/1988 | Jerry | |
| 4,772,541 A | | 9/1988 | Gottschalk et al. | |
| 4,889,786 A | * | 12/1989 | Takahashi | ............ G03F 7/0285 430/281.1 |
| 4,895,880 A | | 1/1990 | Gottschalk et al. | |
| 4,925,827 A | | 5/1990 | Goto et al. | |
| 4,962,010 A | | 10/1990 | Colyer et al. | |
| 5,030,543 A | | 7/1991 | Watanabe et al. | |
| 5,053,309 A | | 10/1991 | Sanders et al. | |

(Continued)

FOREIGN PATENT DOCUMENTS

| | | | | |
|---|---|---|---|---|
| EP | 408227 A1 | * | 1/1991 | ............ G03F 7/029 |
| EP | 0980026 A1 | | 2/2000 | |

(Continued)

OTHER PUBLICATIONS

Translated Description of Honda (Year: 1985).*

(Continued)

*Primary Examiner* — Sean M DeGuire
*Assistant Examiner* — Andrew Preston Traywick
(74) *Attorney, Agent, or Firm* — Foley & Lardner LLP

(57) ABSTRACT

Microcapsules including a polymeric shell and an internal phase including a non-photopolymerizable reactive diluent are provided for use in microcapsule imaging sheets. Imaging sheets including microcapsules which include a non-photopolymerizable reactive diluent, and which exhibit improvements in color development (Dmax), discoloration (yellowing) resistance, mechanical properties (e.g., peel strength), and temperature latitude of imaging sheets including leuco dyes.

21 Claims, 3 Drawing Sheets

(56) References Cited

U.S. PATENT DOCUMENTS

| | | | |
|---|---|---|---|
| 5,100,755 A | 3/1992 | Shanklin | |
| 5,120,475 A | 6/1992 | Chen et al. | |
| 5,292,610 A * | 3/1994 | Helling | G03F 7/027 430/283.1 |
| 5,525,686 A | 6/1996 | Tanabe et al. | |
| 5,620,827 A | 4/1997 | Cheng et al. | |
| 5,783,353 A | 7/1998 | Camillus et al. | |
| 6,030,740 A | 2/2000 | Polykarpov | |
| 6,037,094 A * | 3/2000 | Katampe | G03F 7/002 430/211 |
| RE37,257 E | 7/2001 | Sanders | |
| 6,326,120 B1 | 12/2001 | Wang et al. | |
| 6,468,708 B1 | 10/2002 | Wang et al. | |
| 6,740,465 B2 | 5/2004 | Liang et al. | |
| 7,153,628 B2 | 12/2006 | Liu et al. | |
| 8,334,047 B2 | 12/2012 | Kelly et al. | |
| 2005/0084790 A1 | 4/2005 | Schroeder et al. | |

FOREIGN PATENT DOCUMENTS

| | | | | |
|---|---|---|---|---|
| EP | 3 838 610 A1 | 6/2021 | | |
| JP | S60105584 A * | 6/1985 | | B41M 5/18 |
| JP | H752569 A | 2/1995 | | |
| JP | 2010-082930 A | 4/2010 | | |

OTHER PUBLICATIONS

Vitale, A., Sangermano, M., Bongiovanni, R. Visible Light Curable Restorative Composites for Dental Applications Based on Epoxy Monomer. Materials. 7(1) 554-562 (Year: 2014).*
Arney et al., Grey Scale Characteristics of the Microencapsulated Acrylate Process of Imaging, SPIE vol. 1253 Hard Copy and Printing Materials, Media, and Process, pp. 252-263 (Jul. 1990) (12 pages).
Camillus et al., Exposing Cycolor Film using Telegen's New Linear Head, Cycolor Incorporated; IS&T's NIP18: 2002 Int'l. Conf. on Digital Printing Technologies (4 pages), pp. 441-444.
Cycolor Definition, PC Magazine © 2019 (accessed Apr. 2019) (3 pages).
Gregory, "High-Technology Applications of Organic Colorants", Ch. 8, Plenum Press (1991) (53 pages).
Kumagai, "An Introduction to the Panchromatic Cycolor Process," J. Soc. Photogr. Sci. Technol. Japan, vol. 52, No. 3. (1989) (6 pages), pp. 249-254.
Muthyala, ed., "Chemistry and Applications of Leuco Dyes", Ch. 4, Plenum Press (1997) (29 pages).
Rastogi et al., Cycolor® Imaging Technology, SPIE Proc., vol. 1079, Hard Copy Output, pp. 183-214 (1989) (32 pages).
International Search Report and Written Opinion for International Application No. PCT/IB2023/055710, dated Oct. 20, 2023, 19 pgs.

* cited by examiner

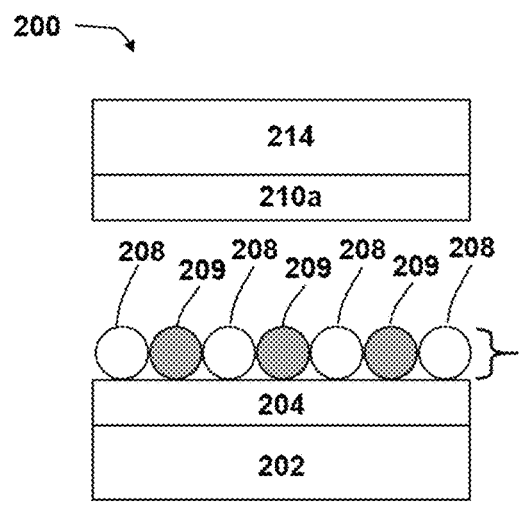 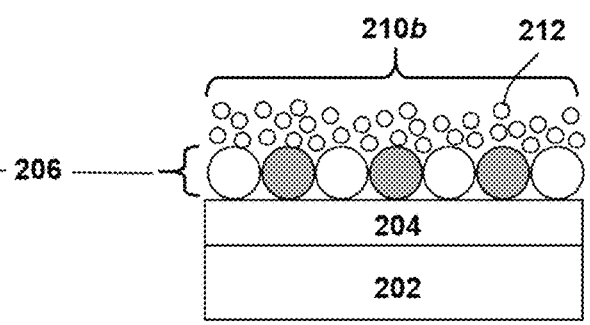
FIG. 2A                    FIG. 2B

MICROCAPSULE IMAGING SYSTEM INCLUDING NON-PHOTOPOLYMERIZABLE REACTIVE DILUENT

FIELD

The present disclosure relates generally to the field of microcapsule imaging systems and more particularly to microcapsules having an internal phase including non-photopolymerizable reactive diluents for use in the same.

BACKGROUND

Single-sheet, self-containing, full-color microcapsule imaging systems (e.g., CYCOLOR® made by Mead Corp. of Miamisburg, OH) have been developed since the 1980s. In such imaging systems, an imaging sheet including a layer of microcapsules including a photo-hardenable or photo-softenable composition and a leuco dye in the internal phase is image-wise exposed to actinic radiation. Typically, the photosensitive composition includes a photopolymerizable, multifunctional acrylate, a photoinitiator, and a color former. Generally, the microcapsules are image-wise hardened by actinic radiation, and upon passing the exposed imaging sheet through a pressure roller, the microcapsules may be image-wise ruptured to release the internal phase encapsulated therein. The leuco dyes thus released migrate to a developer material and react to form a continuous-tone, full-color image with its color density (or grayscale) modulated by the exposure energy (time or pulse width), intensity (pulse amplitude), and/or pulse frequency. Such self-contained, single-sheet imaging systems are utilizable for lightweight, portable, high-speed printing applications.

SUMMARY

Typical microcapsule imaging systems suffer from several drawbacks. For instance, conventional leuco dyes have a poor temperature latitude, particularly at low temperature. To increase the color density, a high concentration of leuco dyes is included in the microcapsules. However, at low storage or operation temperatures, the leuco dyes tend to precipitate, resulting in poor image quality. Additionally, conventional imaging sheets exhibit poor mid-tone color rendition because the mobility of leuco dyes is poor, given the high viscosity of the internal phase, even under low energy exposure or a low degree of polymerization in the internal phase. Thus, the resulting images have a high contrast ratio and loss of mid-tone details. Further, at maximum color density (Dmax), the leuco dyes tend to spread extensively, but slowly, causing a deterioration of image resolution, particularly with respect to edge sharpness.

Some of the above-discussed problems may be circumvented by adding a non-polymerizable, inert solvent or diluent (e.g., dibutyl phthalate, dioctyl phthalate, trioctyl phosphate, trioctyl trimelitate, bis-octyl adipate, dioctyl sebacate, etc.) to improve the solubility of the leuco dye and reduce the viscosity of the internal phase. However, the presence of additional liquid solvent in the imaging sheet may cause non-uniform image quality, poor film integrity, and delamination.

The present inventors discovered that using a non-photopolymerizable but reactive solvent or diluent (e.g., an epoxide compound) addresses the issues of low temperature latitude, mid-tone rendition, and slow rate of color development. The epoxide groups are not photopolymerizable by the radical-type photoinitiators in the internal phase. Upon pressure development of the exposed image sheet, the epoxide released from the ruptured microcapsules reacts and crosslinks with the phenol or carboxylic group of the developers. This results in improved image resolution, edge sharpness, film integrity, and mechanical properties. The rate of the color development by the developer is typically faster than or comparable to that of the epoxide crosslinking reactions. Thus, a high color saturation or high color development rate may be achieved without making typical tradeoffs in image quality and film integrity.

In one aspect, which may be combined with any other aspect or embodiment, the present disclosure relates to a photosensitive microcapsule for a microcapsule imaging sheet, comprising: a polymeric shell; and an internal phase, comprising: a leuco dye; a non-photopolymerizable diluent configured to react with a leuco dye developer; a photoinitiator; and a polymerizable or crosslinkable monomer or oligomer, preferably multifunctional monomer or oligomer.

In some embodiments, the leuco dye developer comprises a Lewis acid, an acid clay, or one or more compounds comprising a phenol group or carboxylic acid group, or metal complexes thereof. In some embodiments, the leuco dye developer comprises a novolac resin, a salicylic acid derivative, a zincate derivative thereof, or a combination, copolymer, blend, composite, or metal complex derivative thereof.

In some embodiments, the diluent comprises an epoxide compound. In some embodiments, the epoxide compound comprises two or more epoxide moieties. In some embodiments, the diluent comprises a di-epoxide or tri-epoxide compound. In some embodiments, the epoxide compound comprises at least one selected from the group consisting of: triglycidyl trimethylolpropane (TMPTGE); epoxided oils including epoxided soybean oil; epoxided castor oil; epoxided linseed oil; dicyclopentadiene diepoxide; cycloaliphatic diepoxide; 3,4-epoxycyclohexylmethyl-3,4-epoxycyclohexanecarboxylate; and 1,2-cyclohexanedicarboxylic acid diglycidyl ester.

In some embodiments, the diluent is present at a concentration of about 3 wt. % to about 20 wt. %, relative to a total weight of the internal phase. In some embodiments, the diluent is present at a concentration of about 3 wt. % to about 10 wt. %, relative to a total weight of the internal phase.

In some embodiments, the diluent has a water solubility of less than or equal to about 5 wt. %. In some embodiments, the diluent has a water solubility of less than or equal to about 1 wt. %.

In some embodiments, the diluent has a viscosity of less than or equal to about 300 cps at 25° C., determined using a Brookfield viscometer at 100 rpm. In some embodiments, the diluent has a viscosity of less than or equal to about 100 cps at 25° C., determined using a Brookfield viscometer at 100 rpm.

In some embodiments, the internal phase further comprises a co-initiator, oxygen scavenger, or auto-oxidizer. Suitable oxygen scavengers include but are not limited to N,N,-dialkyl derivatives such as ethyl 4-(dimethylamino) benzoate, N,N-dimethylamino diisopropylbenzene (DIDMA), and N,N,-dimethylethyl acrylate. Suitable autooxidizers include but are not limited to organo-disulfides such as mercaptobenzothiazole disulfide (MTBS) and 2-ethoxy mercaptobenzothiazole disulfide.

In some embodiments, the polymerizable or crosslinkable monomer or oligomer comprises a multifunctional acrylate.

In another aspect, which may be combined with any other aspect or embodiment, the present disclosure relates to an imaging sheet, comprising: (i) a microcapsule comprising: a polymeric shell; and an internal phase, the internal phase of the microcapsule comprising: a leuco dye; a non-photopolymerizable diluent configured to react with a leuco dye developer; a photoinitiator; and a polymerizable or crosslinkable monomer or oligomer; (ii) a first substrate in contact with the microcapsule; and (iii) a leuco dye developer. In some embodiments, the first substrate is in contact with the microcapsule.

In some embodiments, the leuco dye developer comprises a Lewis acid, an acid clay, one or more compounds comprising a carboxylic acid group or a phenol group, or metal complexes thereof. In some embodiments, the leuco dye developer is a novolac resin, phenolic resin, salicylic acid, or a combination, copolymer, blend, composite, or a metal complex derivative thereof. In some embodiments, the metal is zinc.

In some embodiments, the imaging sheet further comprises a second substrate in contact with the leuco dye developer. In some embodiments, one of the first and second substrates is opaque. In some embodiments, the opaque substrate is white. In some embodiments, the first substrate is opaque or white.

In some embodiments, the first substrate further comprises a primer layer in contact with the microcapsule. In some embodiments, the primer layer comprises a particulate. In some embodiments, the particulate comprises at least one selected from the group consisting of: $CaCO_3$, $CaSO_4$, $BaSO_4$, silica, $TiO_2$, $Al_2O_3$, BN, $Ca_3(PO_4)_2$, and hydrophobic-treated derivatives thereof.

In another aspect, which may be combined with any other aspect or embodiment, the present disclosure relates to a microcapsule for a microcapsule imaging sheet, comprising: a polymeric shell; and an internal phase comprising a non-photopolymerizable diluent configured to react with a leuco dye developer.

In some embodiments, the diluent comprises an epoxide compound. In some embodiments, the epoxide compound comprises two or more epoxide moieties. In some embodiments, the diluent comprises a di-epoxide or tri-epoxide compound. In some embodiments, the epoxide compound comprises at least one selected from the group consisting of: triglycidyl trimethylolpropane (TMPTGE); epoxided oils including epoxided soybean oil; epoxided castor oil; epoxided linseed oil; dicyclopentadiene diepoxide; cycloaliphatic diepoxide; 3,4-epoxycyclohexylmethyl-3,4-epoxycyclohexanecarboxylate; and 1,2-cyclohexanedicarboxylic acid diglycidyl ester.

In some embodiments, the diluent is present at a concentration of about 50 wt. % to about 100 wt. %, relative to a total weight of the internal phase. In some embodiments, the diluent is present at a concentration of about 90 wt. % to about 100 wt. %, relative to a total weight of the internal phase.

In another aspect, which may be combined with any other aspect or embodiment, the present disclosure relates to an imaging sheet, comprising: (i) a diluent microcapsule comprising: a polymeric shell; and an internal phase comprising a non-photopolymerizable diluent configured to react with a leuco dye developer; and (ii) a photosensitive microcapsule, comprising: a polymeric shell; and an internal phase, comprising: a leuco dye; a photoinitiator; and a polymerizable or crosslinkable monomer or oligomer; (iii) a first substrate in contact with the microcapsule; and (iv) a leuco dye developer.

In some embodiments, the leuco dye developer comprises a Lewis acid, an acid clay, or one or more compounds comprising a phenol group or a carboxylic acid group.

In some embodiments, the diluent comprises an epoxide compound. In some embodiments, the epoxide compound comprises two or more epoxide moieties. In some embodiments, the diluent comprises a di-epoxide or tri-epoxide compound. In some embodiments, the epoxide compound comprises at least one selected from the group consisting of: triglycidyl trimethylolpropane (TMPTGE); epoxided oils including epoxided soybean oil; epoxided castor oil; epoxided linseed oil; dicyclopentadiene diepoxide; cycloaliphatic diepoxide; 3,4-epoxycyclohexylmethyl-3,4-epoxycyclohexanecarboxylate; and 1,2-cyclohexanedicarboxylic acid diglycidyl ester.

In some embodiments, the diluent is present at a concentration of about 50 wt. % to about 100 wt. %, relative to a total weight of the internal phase. In some embodiments, the diluent is present at a concentration of about 90 wt. % to about 100 wt. %, relative to a total weight of the internal phase of the diluent microcapsule.

In some embodiments, the leuco dye developer is a novolac resin, phenolic resin, salicylic acid, or a combination, a copolymer, a blend, a composite, or a metal complex derivative thereof. In some embodiments, the metal is zinc.

In some embodiments, the imaging sheet further comprises a second substrate in contact with the leuco dye developer. In some embodiments, one of the first and second substrates is opaque. In some embodiments, the opaque substrate is white.

In some embodiments, the first substrate further comprises a primer layer in contact with the microcapsule. In some embodiments, the primer layer comprises a particulate. In some embodiments, the particulate comprises at least one selected from the group consisting of: $CaCO_3$, $CaSO_4$, $BaSO_4$, silica, BN, $Al_2O_3$, $TiO_2$, $Ca_3(PO_4)_2$, hydrophobic-treated derivatives thereof, and any combination thereof.

In some embodiments, the internal phase of the photosensitive microcapsule further comprises a non-photopolymerizable diluent configured to react with a leuco dye developer. In some embodiments, the diluent comprises an epoxide compound. In some embodiments, the epoxide compound comprises two or more epoxide moieties. In some embodiments, the diluent comprises a di-epoxide or tri-epoxide compound. In some embodiments, the epoxide compound comprises at least one selected from the group consisting of: triglycidyl trimethylolpropane (TMPTGE); epoxided oils including epoxided soybean oil; epoxided castor oil; epoxided linseed oil; dicyclopentadiene diepoxide; cycloaliphatic diepoxide; 3,4-epoxycyclohexylmethyl-3,4-epoxycyclohexanecarboxylate; and 1,2-cyclohexanedicarboxylic acid diglycidyl ester.

In another aspect, which may be combined with any other aspect or embodiment, the present disclosure relates to a microcapsule composition, comprising: one or more microcapsules according to any of the embodiments disclosed herein; and a carrier, wherein the one or more microcapsules is dispersed in the carrier.

In another aspect, which may be combined with any other aspect or embodiment, the present disclosure relates to a method of preparing an imaging sheet, the method comprising: (i) contacting a first substrate with a microcapsule layer to produce a microcapsule-coated first substrate; (ii) contacting the microcapsule layer of the microcapsule-coated first substrate with a developer layer to produce a developer-coated first substrate; and (iii) contacting the developer layer of the developer-coated first substrate with a second substrate to produce an imaging sheet.

In another aspect, which may be combined with any other aspect or embodiment, the present disclosure relates to a method of preparing an imaging sheet, the method comprising: (i-a) contacting a first substrate with a primer layer to produce a primer-coated first substrate; (i-b) contacting the primer layer of the primer-coated first substrate with a microcapsule layer to produce a microcapsule-coated first substrate; (ii) contacting the microcapsule layer of the microcapsule-coated first substrate with a developer layer to produce a developer-coated first substrate; and (iii) contacting the developer layer of the developer-coated first substrate with a second substrate to produce an imaging sheet.

In another aspect, which may be combined with any other aspect or embodiment, the present disclosure relates to a method of preparing an imaging sheet, the method comprising: method of preparing an imaging sheet, the method comprising: (i) producing the microcapsule-coated first substrate according any of the embodiments disclosed herein (e.g., contacting a first substrate or a primer-coated first substrate with a microcapsule layer); (ii) contacting a second substrate with a developer layer to produce a developer-coated second substrate; (iii) contacting the microcapsule layer of the microcapsule-coated first substrate with the developer layer of the developer-coated second substrate to produce an imaging sheet.

In some embodiments, a primer layer according to any of the embodiment disclosed herein is positioned (i) between the second substrate and the developer layer, (ii) between the second substrate and the developer layer or between the first substrate and the microcapsule layer, or (iii) between the second substrate and the developer layer and between the first substrate and the microcapsule layer.

In another aspect, which may be combined with any other aspect or embodiment, the present disclosure relates to a method of improving one or more properties of an imaging sheet, the method comprising including in (or adding to) the imaging sheet one or more microcapsules according to any one of the embodiments disclosed herein. In some embodiments, the one or more properties includes one or more of Dmax; fresh Dmax; Dmax, t; Dmin; image resolution; temperature latitude; dynamic range; discoloration (yellowing) resistance; and edge sharpness.

BRIEF DESCRIPTION OF THE DRAWINGS

FIG. 2A is a schematic illustration of an embodiment of an imaging sheet having separate photosensitive leuco dye microcapsules and non-photosensitive diluent microcapsules, according to the present disclosure.

FIG. 2B is a schematic illustration of a microcapsule imaging sheet having separate photosensitive leuco dye microcapsules and non-photosensitive diluent microcapsules, according to the present disclosure.

DETAILED DESCRIPTION

In the following description, numerous specific details are set forth in order to provide a thorough understanding of the present technology. Particular exemplary embodiments of the present technology may be implemented without some or all of these specific details. In other instances, certain process operations have not been described in detail but would be understood by the skilled person in the art.

Figures 1A, 1B:
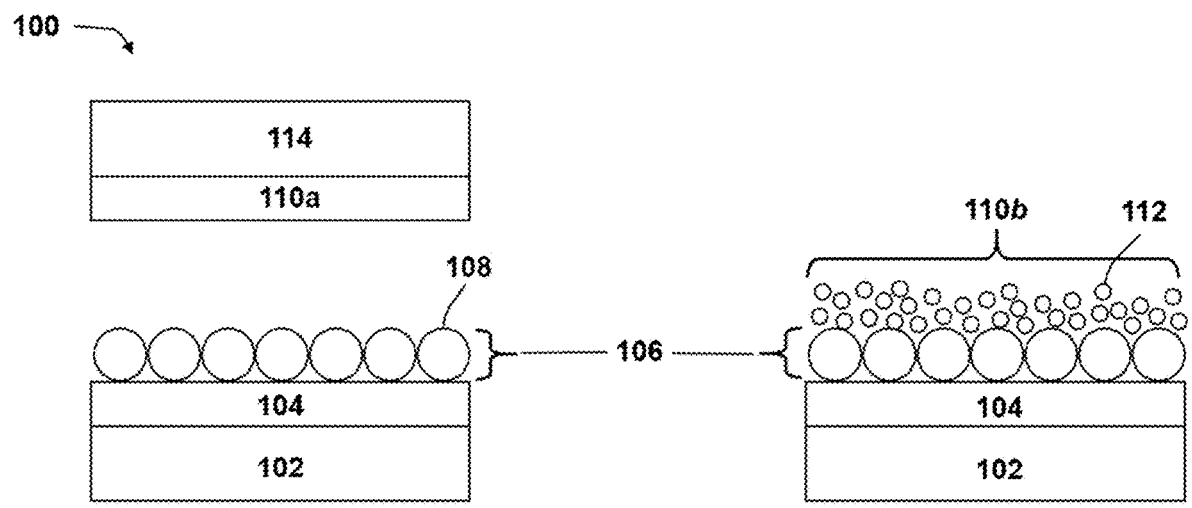
FIG. 1A is a schematic illustration of an embodiment of an imaging sheet having photosensitive microcapsules including a leuco dye and non-photopolymerizable reactive diluent within the same microcapsule, according to the present disclosure.
FIG. 1B is a schematic illustration of an embodiment of an imaging sheet having photosensitive microcapsules with a leuco dye and non-photopolymerizable reactive diluent within the same microcapsule, according to the present disclosure.

Referring to FIG. 1A, in some embodiments, a microcapsule imaging sheet 100 according to the present disclosure includes a microcapsule layer 106 comprising microcapsules 108 (e.g., photosensitive and/or non-photosensitive microcapsules) disposed on a first substrate 102, which may optionally include a primer layer 104 in contact with the first substrate and/or the microcapsule layer 106. The microcapsule layer may be in contact with a developer layer 110a disposed on a second substrate 114, which is configured to be separately placed into contact with the microcapsule layer 106.

Alternatively, as shown in FIG. 1B, the microcapsule layer 106 may be over-coated with a developer layer 110b. The resulting microcapsule/developer imaging sheet may be used as-is or laminated with the second substrate 114, which may be pre-coated with a layer of adhesive (not shown). Alternatively, the microcapsule layer composition may be mixed with the developer layer composition and coated as a single layer (not shown).

Figure 1C:
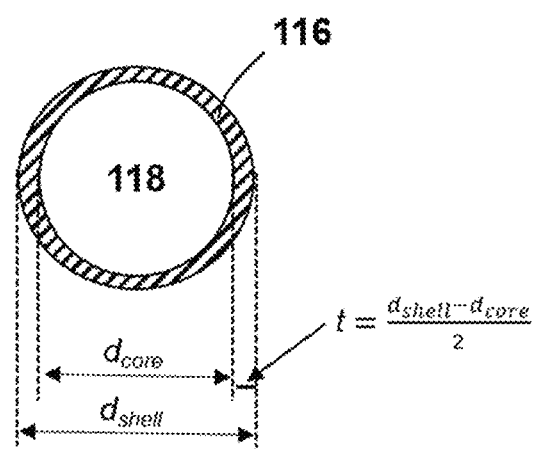
FIG. 1C is a schematic illustration (a cross-sectional side view) of a microcapsule according to the present disclosure.

Referring to FIG. 1C, microcapsules 108 may be photosensitive microcapsules, which comprise a polymeric shell 116 and a core (or internal phase) 118 encapsulated therein, which can be either softened or hardened by actinic irradiation. The internal phase 118 comprises a dye (e.g., a leuco dye), which imparts color to the microcapsule imaging sheet upon release under pressure and simultaneous or subsequent exposure to heat, certain pH conditions, reactive chemical species, or a developer. Upon release from the microcapsule 108, the dye (e.g., a leuco dye) undergoes a chemical transformation, transitioning from a colorless state to a color state (e.g., magenta, cyan, yellow, or black).

The internal phase 118 of the photosensitive microcapsule(s) may further comprise one or more photoinitiators, one or more multifunctional monomers or oligomers, and one or more non-photopolymerizable reactive diluents. The non-photopolymerizable reactive diluent may be configured to react with Lewis acids, phenol groups, or carboxylic acid groups (e.g., in the developer layer), and their metal complexes, particularly their zincated derivatives, but may not react with the photoinitiators, sensitizers, co-photoinitiators, oxygen scavengers, auto-oxidizers, chain-transfer agents and/or monomers or oligomers which may be present in the internal phase 118. Suitable oxygen scavengers include but are not limited to N,N,-dialkyl derivatives such as ethyl 4-(dimethylamino) benzoate, N,N-dimethylamino diisopropylbenzene (DIDMA), and N,N,-dimethylethyl acrylate. Suitable autooxidizers include but are not limited to, organo-disulfides such as mercaptobenzothiazole disulfide (MTBS) and alkoxy mercaptobenzothiazole disulfides, including 2-ethoxy mercaptobenzothiazole disulfide.

Photosensitive microcapsules 108 may comprise a polymeric shell and a light-sensitive core which may be photohardened by polymerizing or crosslinking the monomers/oligomers included therein. In some embodiments, the photohardenable monomer may be replaced with a photosoftenable or photodegradable composition.

The polymeric shell may be formed by, e.g., interfacial or in-situ polymerization/crosslinking, simple or complex coacervation processes, phase separation, or combinations thereof. In some embodiments, suitable polymeric shells include, but are not limited to, polyurea, polythiourea, polyurethane, polythiourethane, polyallophanate, polycarbamate, polysulfone, melamine-formaldehyde or urea-formaldehyde condensate, gelatin-gum Arabic complex, gelatin-carboxymethyl cellulose complex, and their copolymers, interpolymer complexes, blends or composites. In some embodiments, water-insoluble polymers that are incompatible with or non-swellable/insoluble in the internal phase are preferable as the shell materials, as they tend to show favorable barrier properties against moisture and/or oxygen.

The shell provides desirable oxygen barrier properties to assure a high photosensitivity of the photosensitive core and avoid any premature intermixing of photoinitiators and dye precursors of various colors, thereby assuring a successful color separation and reproduction.

In some embodiments, the photohardenable core comprises a dye (e.g., a leuco dye), a photoinitiator or sensitizer, and a polymerizable or crosslinkable monomer or oligomer. In some embodiments, the core comprises a multifunctional monomer or oligomer. In some embodiments, the monomer or oligomer is selected from multifunctional acrylates and methacylates, multifunctional vinylethers, multifunctional allyls or vinylbenzenes, and their oligomers, dendrimers or blends. Multifunctional acrylates are suitable due to their superior photospeed, compatibility with leuco dyes and developers, and outdoor weatherability. Exemplary multifunctional acrylates include, but are not limited to, pentaerythritol triacrylate (PETA-3), pentaerythritol tetra-acrylate (PETA-4), dipentaerythritol hexaacrylate (DPHA), dipentaerythritol pentaacrylate (DPPA), trimethylolpropane triacrylate (TMPTA), 1,6-hexanediol diacrylate (HDDA), tripropylene glycol diacrylate (TPGDA), and neopentyl glycol diacrylate (NPGDA). In some embodiments, the leuco dye is one or more of a cyan, magenta or yellow leuco dye.

The microcapsule layer may comprise one or more types of microcapsules. For instance, the microcapsules may be sensitive to red visible light, green visible light, or blue visible light. The microcapsule layer may comprise red-sensitive, green-sensitive, or blue-sensitive microcapsules, in which case the microcapsule imaging sheet is considered a "full-color" imaging sheet. In some embodiments, the dye is a cyan, magenta, yellow or black leuco dye. By way of non-limiting example, a representative magenta leuco dye may include PERGASCRIPT® Red I6B (CAS: 50292-95-0, Synamedia-chem). In some embodiments, the photoinitiator is a blue-sensitive ketocoumarin, cyanine borate or semi-cyanine borate.

Referring now to FIG. 2, in some embodiments, the non-photopolymerizable reactive diluent is present in a separate microcapsule in which the internal phase does not comprise a dye, photoinitiator, or multifunctional oligomer. In such embodiments, the microcapsule layer 206 may comprise at least two different types of microcapsules: dye microcapsules 208 and diluent microcapsules 209. In some embodiments, the dye microcapsules may include the components and features discussed above (e.g., polymeric shell, leuco dye, photoinitiator, multifunctional monomers or oligomers), and the non-photopolymerizable reactive diluent. In some embodiments, the dye microcapsules may include the components and features discussed above (e.g., polymeric shell, leuco dye, photoinitiator, multifunctional monomers or oligomers), except the non-photopolymerizable reactive diluent. In some embodiments, the diluent microcapsules comprise a polymeric shell and an internal phase comprising the non-photopolymerizable reactive diluent.

In some embodiments, the diluent microcapsules may be non-photosensitive, while the dye microcapsules may be photosensitive. In some embodiments, the presence of the diluent in a separate microcapsule from the photosensitive dye microcapsules affords an improvement in the mechanical properties of the imaging sheet 200 (e.g., peeling strength) and the discoloration resistance of the imaging sheet (e.g., a lower yellow Dmin), but may afford relatively little improvement in the temperature latitude, when compared to embodiments in which the diluent and dye are present in the same microcapsule.

In some embodiments, the microcapsule imaging system comprises photosensitive diluent microcapsules comprising a shell, a non-photopolymerizable diluent, photoinitiator or sensitizer and a multifunctional monomer.

In some embodiments according to FIG. 2, first substrate 202, optional primer layer 204, photosensitive dye microcapsules 208, diluent microcapsules 209, developer layer 210a, developer particles 210b, and second substrate 214 are the same as described for the embodiments of FIGS. 1A and 1B.

In some embodiments, the imaging sheet is exposed from the developer side. In some embodiments, the imaging sheet is exposed from the microcapsule side. In some embodiments, the microcapsule sheet is exposed first and the developer sheet is subsequently laminated with the exposed microcapsule sheet under pressure to form a sandwiched sheet with the image developed therein. In some embodiments, the microcapsule sheet is peeled apart from the above-mentioned sandwich structure to leave the color images on the developer sheet.

Microcapsule Layer

The microcapsule layer comprises photosensitive microcapsules which have a polymeric shell and an internal phase (or core). In some embodiments, the internal phase of the microcapsules comprises a leuco dye, a photoinitiator, one or more multifunctional monomers or oligomers, and one or more non-photopolymerizable reactive diluents.

In some embodiments, the microcapsule layer comprises: (i) photosensitive dye microcapsules, which include a polymeric shell and an internal phase including a leuco dye, photoinitiator, and multifunctional monomers or oligomers but not a non-photopolymerizable reactive diluent; and (ii) non-photosensitive diluent microcapsules comprising a polymeric shell and an internal phase comprising, consisting essentially of, or consisting of the non-photopolymerizable reactive diluent.

In some embodiments, the dye microcapsules are photosensitive, while the diluent microcapsules are non-photosensitive—that is, the core is neither softened nor hardened by actinic irradiation. In some embodiments, both the dye and diluent microcapsules are photosensitive, in which the core is either softened or hardened by actinic irradiation.

In some embodiments, the microcapsule layer comprises a dye microcapsule at a concentration, measured by dry weight relative to the total dry weight of the microcapsule layer, at least about 50 wt. %, at least about 70 wt. %, at least about 80 wt. %, at least about 85 wt. %, at least about 90 wt. %, or any range or value therein between.

In some embodiments, the microcapsule layer comprises one or more diluent microcapsules at a concentration, measured by dry weight relative to the total dry weight of the microcapsule layer, of at least about 1 wt. %, at least about 2 wt. %, at least about 3 wt. %, at least about 4 wt. %, at least about 5 wt. %, at least about 6 wt. %, at least about 7 wt. %, at least about 8 wt. %, at least about 9 wt. %, at least about 10 wt. %, at least about 11 wt. %, at least about 12 wt. %, at least about 13 wt. %, at least about 14 wt. %, at least about 15 wt. %, at least about 16 wt. %, at least about 17 wt. %, at least about 18 wt. %, at least about 19 wt. %, at least about 20 wt. %, at least about 25 wt. %, at least about 30 wt. %, or any range or value therein between.

In some embodiments, the diluent microcapsule may comprise two or more types of diluents. In some embodiments, the diluent microcapsules may comprise a first diluent and a second diluent, at a weight ratio of the first diluent microcapsule to the second diluent microcapsule of about 1:10, 1:9, 1:8, 1:7, 2:7, 3:7, 4:7, 1:6, 1:5, 2:5, 3:5, 4:5 1:4, 3:4 1:3, 2:3 1:2, 1:1, 2:1, 3:2, 3:1, 4:3, 4:1, 5:4, 5:3, 5:2, 5:1, 6:1, 7:4, 7:3, 7:2, 7:1, 8:1, 9:1, 10:1, or any range or value therein.

In some embodiments, the microcapsule layer may comprise two or more types of diluent microcapsules. In some embodiments, the microcapsule layer may comprise a first diluent microcapsule and a second diluent microcapsule, at a weight ratio of the first diluent microcapsule to the second diluent microcapsule of about 1:10, 1:9, 1:8, 1:7, 2:7, 3:7, 4:7, 1:6, 1:5, 2:5, 3:5, 4:5 1:4, 3:4 1:3, 2:3 1:2, 1:1, 2:1, 3:2, 3:1, 4:3, 4:1, 5:4, 5:3, 5:2, 5:1, 6:1, 7:4, 7:3, 7:2, 7:1, 8:1, 9:1, 10:1, or any range or value therein.

In some embodiments, the microcapsules have a $D_{10}$ particle size of at least about 1 μm (10% of the particles are smaller than 1 μm), at least about 1.5 μm, or at least about 2 μm.

In some embodiments, the microcapsules have a $D_{50}$ particle size of at least about 2 μm (50% of the particles are smaller than 2 μm), at least about 3 μm, or at least about 4 μm. In some embodiments, the microcapsules have a $D_{50}$ particle size of no greater than about 15 μm, no greater than about 12 μm, or no greater than about 10 μm. The pressure required to break the microcapsules decreases dramatically with increasing particle size. Microcapsules with a $D_{50}$ of less than about 2 μm are difficult to break by pressure readily available for portable printers, particularly hand-held printers. Additionally, since a minimum shell thickness is often required to ensure appropriate barrier properties to protect the internal phase from prematurely damaging or leaking out of the microcapsule, a smaller $D_{50}$ implies a lower payload of the internal phase in which leuco dyes are dissolved. As a result, small microcapsules tend to result in imaging systems of low maximum color density (Dmax).

In contrast, microcapsules with a $D_{50}$ of greater than about 15 μm may be more easily crushed during media handling and processing. Thus, imaging systems comprising microcapsules with a $D_{50}$ greater than about 15 μm often exhibit images of a higher Dmin (minimum color density in the non-imaging or white area) and poorer resolution.

Polymeric Shell

In some embodiments, the microcapsule (e.g., dye microcapsule or diluent microcapsule) comprises a polymer shell that is either photosensitive or non-photosensitive. The polymeric shell may be formed by processes including, but not limited to, interfacial or in situ polymerization/cross-linking, simple or complex coacervation processes, phase separation, or combinations thereof. Suitable polymeric shells include, but are not limited to, polyurea, polythiourea, polyurethane, polythiourethane, polyallophanate, polycarbamate, polysulfone, melamine-formaldehyde or urea-formaldehyde condensate, gelatin-gum Arabic complex, gelatin-carboxymethyl cellulose, or pectin complex, and copolymers, interpolymer complexes, blends, or composites thereof. In some embodiments water-insoluble polymers that are incompatible with or non-swellable/insoluble in the internal phase are suitable as the shell materials because they tend to exhibit superior barrier properties against moisture and/or oxygen.

Leuco Dye

In some embodiments, the internal phase of the microcapsules comprises a leuco dye. In some embodiments, the dye is a cyan, magenta, yellow, or black leuco dye. By way of non-limiting example, a representative magenta leuco dye may include PERGASCRIPT® Red I6B (CAS: 50292-95-0, Synamedia-chem); COPIKEM 35 (CAS: 50292-91-6), Blue I-2G and Blue-63 from BASF, Blue 220, Blue 203, Red 500, Red 40 or Black 305 from Yamada, JYDY-1, JYDR-2, JYDR-3, JYDB-1, or JYDB-2 from WuXi Jiayida New Materials, Red-16, O-C6, or O-C8 from Synmedia Chemicals, or ODB-2 from Anyang General Chemicals. Additional suitable examples of leuco dyes are disclosed in, e.g., CHEMISTRY AND APPLICATIONS OF LEUCO DYES (R. Muthyala ed., 1997), which is hereby incorporated by reference.

In some embodiments, the leuco dye is present in the internal phase at a concentration, by weight, relative to the total weight of the internal phase, of at least about 1 wt. %, at least about 2 wt. %, at least about 3 wt. %, at least about 4 wt. %, at least about 5 wt. %, at least about 6 wt. %, at least about 7 wt. %, at least about 8 wt. %, at least about 9 wt. %, at least about 10 wt. %, at least about 11 wt. %, at least about 12 wt. %, at least about 13 wt. %, at least about 14 wt. %, at least about 15 wt. %, at least about 16 wt. %, at least about 17 wt. %, at least about 18 wt. %, at least about 19 wt. %, at least about 20 wt. %, at least about 25 wt. %, at least about 30 wt. %, at least about 35 wt. %, at least about 40 wt. %, at least about 45 wt. %, at least about 50 wt. %, or any range or value therein between.

In some embodiments, the leuco dye is present in the internal phase at a concentration, by weight, relative to the total weight of the internal phase, of no greater than about 50 wt. %, no greater than about 45 wt. %, no greater than about 40 wt. %, no greater than about 35 wt. %, no greater than about 30 wt. %, no greater than about 25 wt. %, or any range or value therein between.

In some embodiments, the leuco dye is present in the internal phase at a concentration, by weight, relative to the total weight of the internal phase, of about 1 wt. % to about 50 wt. %, about 5 wt. % to about 40 wt. %, or about 10 wt. % to about 30 wt. %.

Photoinitiator

In some embodiments, the one or more photoinitiators comprises one or more borate initiators of the general structure

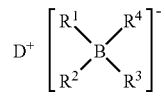

wherein $D^+$ is a cationic chromophore, such as a cyanine, squaraine (e.g., squarylium), thiopyrylium, or triarylmethane. In some embodiments, $R^1$, $R^2$, $R^3$, and $R^4$ are each independently a substituted or unsubstituted alkyl, arylalkyl, or aryl group. In some embodiments, $R^1$ is an alkyl or arylalkyl group, and $R^2$, $R^3$, and $R^4$ are aryl groups. In some embodiments, the one or more photoinitiators comprise one or more of ketocoumarins, benzophenones, thioxanthones, and Norrish Type I, II and III photoinitiators, and combinations thereof.

In some embodiments, the one or more photoinitiators are present in the internal phase at a concentration, by weight, relative to the total weight of the internal phase, of greater than or equal to about 0.01 wt. %, greater than or equal to about 0.02 wt. %, greater than or equal to about 0.03 wt. %, greater than or equal to about 0.04 wt. %, greater than or equal to about 0.05 wt. %, greater than or equal to about 0.1 wt. %, greater than or equal to about 0.2 wt. %, greater than or equal to about 0.3 wt. %, greater than or equal to about 0.4 wt. %, greater than or equal to about 0.5 wt. %, greater than or equal to about 1.0 wt. %, greater than or equal to about 2.0 wt. %, greater than or equal to about 3.0 wt. %, greater than or equal to about 4.0 wt. %, greater than or equal to about 5.0 wt. %, greater than or equal to about 10.0 wt. %, or any range or value therein between.

In some embodiments, the one or more photoinitiators are present in the internal phase at a concentration, by weight, relative to the total weight of the internal phase, of less than or equal to about 10.0 wt. %, less than or equal to about 5.0 wt. %, less than or equal to about 4.0 wt. %, less than or equal to about 3.0 wt. %, less than or equal to about 2.0 wt. %, less than or equal to about 1.0 wt. %, less than or equal to about 0.5 wt. %, less than or equal to about 0.4 wt. %, less than or equal to about 0.3 wt. %, less than or equal to about 0.2 wt. %, less than or equal to about 0.1 wt. %, less than or equal to about 0.05 wt. %, less than or equal to about 0.04 wt. %, less than or equal to about 0.03 wt. %, less than or equal to about 0.02 wt. %, less than or equal to about 0.01 wt. %, or any range or value therein between.

In some embodiments, the one or more photoinitiators are present in the internal phase at a concentration, by weight, relative to the total weight of the internal phase, of about 0.01 wt. % to about 10.0 wt. %, about 0.01 wt. % to about 5.0 wt. %, about 0.01 wt. % to about 1.0 wt. %, about 0.01 wt. % to about 0.5 wt. %, about 0.01 wt. % to about 0.1 wt. %, about 0.01 wt. % to about 0.05 wt. %, about 0.05 wt. % to about 10.0 wt. %, about 0.1 wt. % to about 10.0 wt. %, about 0.1 wt. % to about 10.0 wt. %, about 0.5 wt. % to about 10.0 wt. %, about 1.0 wt. % to about 10.0 wt. %, about 5.0 wt. % to about 10.0 wt. %, about 0.05 wt. % to about 5.0 wt. %, about 0.1 wt. % to about 1.0 wt. %, or any range or value therein.

Monomers or Oligomers

In some embodiments, the internal phase of the microcapsule (e.g., the dye microcapsule) comprises one or more monomers or oligomers. In some embodiments, the monomers or oligomers are polymerizable or crosslinkable. In some embodiments, the monomers or oligomers are photo-softenable or photo-hardenable. In some embodiments, the one or more monomers include multifunctional monomers. In some embodiments, the monomers or oligomers may comprise acrylic or methacrylic esters of polyhydric alcohols, acrylate- or methacrylate-terminated epoxy resins, acrylate- or methacrylate-terminated polyesters or polyurethanes, vinylbenzene, vinylethers, or maleimide terminated oligomers or polymers, and copolymers, blends, or combinations thereof. By way of non-limiting example, in some embodiments the one or more monomers or oligomers comprise trimethylolpropane triacrylate (TMPTA), pentaerythritol tetraacrylate, pentaerythritol tetramethacrylate, dipentaerythritol hydroxypentacrylate (DPHPA), tris(2-hydroxyethyl) isocyanurate triacrylate, 1,2,4-butane triol trimethacrylate, 1,4-cyclohexanediol diacrylate, 1,4-benzenediol dimethacrylate, diethylene triamine tris-methacrylamide, vinyl esters (e.g., divinyl succinate), divinyl adipate, divinyl phthalate, divinyl terephthalate, divinylbenzene, or any combination thereof. In some embodiments, the monomers or oligomers comprise multifunctional acrylates.

In some embodiments, the one or more monomers or oligomers are present in the internal phase at a concentration by weight, relative to the total weight of the internal phase, of at least about 30 wt. %, at least about 35 wt. %, at least about 40 wt. %, at least about 45 wt. %, at least about 50 wt. %, at least about 55 wt. %, at least about 60 wt. %, at least about 65 wt. %, at least about 70 wt. %, at least about 75 wt. %, at least about 80 wt. %, at least about 85 wt. %, at least about 90 wt. %, or any range or value therein between.

In some embodiments, the one or more monomers or oligomers are present in the internal phase at a concentration by weight, relative to the total weight of the internal phase, of no greater than about 90 wt. %, no greater than about 85 wt. %, no greater than about 80 wt. %, no greater than about 75 wt. %, no greater than about 70 wt. %, no greater than about 65 wt. %, no greater than about 60 wt. %, no greater than about 55 wt. %, no greater than about 50 wt. %, no greater than about 45 wt. %, no greater than about 40 wt. %, no greater than about 35 wt. %, no greater than about 30 wt. %, or any range or value therein between.

In some embodiments, the one or more monomers or oligomers are present in the internal phase at a concentration by weight, relative to the total weight of the internal phase, of about 40 wt. % to about 90 wt. %, about 50 wt. % to about 85 wt. %, or about 60 wt. % to about 80 wt. %.

Diluent

In some embodiments, instead of an inert solvent or diluent, a non-photopolymerizable but reactive diluent (e.g., an epoxide) is used to increase temperature latitude, mid tone rendition, peel strength, and rate of color development. In some embodiments, the diluent is an epoxide compound. In some embodiments, the epoxide compound comprises at least 1, at least 2, at least 3, at least 4, at least 5, or at least 6 epoxide groups, preferably about 2 to 6 epoxide groups. By way of non-limiting example, the diluent may comprise triglycidyl trimethylolpropane (TMPTGE), epoxided oils including epoxide soybean oil, epoxided castor oil, epoxide linseed oil, dicyclopentadiene diepoxide, cycloaliphatic diepoxide, 3,4-epoxycyclohexylmethyl-3,4-epoxycyclohexanecarboxylate, 1,2-cyclohexanedicarboxylic acid diglycidyl ester, or any combination thereof.

In some embodiments, the epoxide groups are not photopolymerizable by the radical-type photoinitiators which may be present in the internal phase. In some embodiments, the epoxide compounds are configured to react with Lewis acids, phenol groups, or carboxylic groups, and/or the metal complexes, particularly zinc complexes, thereof. Thus, upon pressure development of the exposed image sheet, the epoxides released from the ruptured microcapsules will react and crosslink with the Lewis acid, phenol, or carboxylic acid group of the developer(s). This results in a high image resolution and edge sharpness with an improved media film integrity and mechanical properties.

The phenol groups of the dye developer are in general sensitive to thermal- or photo-oxidation and upon aging tend to show a high degree of yellow background color (high yellow Dmin or discoloration). The reaction with the epoxide released from the microcapsules converts the phenol group to a non-yellowing phenoxy group and effectively reduces the yellow Dmin or the degree of discoloration after aging. The rate of color development by the developer is typically faster than or comparable to that of the epoxide crosslinking reactions. Accordingly, a high color saturation or high color development rate with a high discoloration resistance may be achieved without sacrificing image quality and physico-mechanical properties.

In some embodiments, the diluent comprises one or more epoxide compounds at a suitable concentration for improving temperature latitude, Dmax, mid-tone color rendition, image resolution, and edge sharpness. Too high a concentration of the diluent may afford insufficient photopolymerization/crosslinking of the internal phase, thereby producing an image with a "dirty" background (a poor Dmin). In contrast, improvements in temperature latitude, Dmax, midtone color, resolution, and edge sharpness may be insignificant if the concentration of the epoxide is too low.

In some embodiments, the one or more diluents (e.g., epoxide compounds) are present in the internal phase at a concentration, by weight, relative to the total weight of the internal phase, of at least about 0.1 wt. %, at least about 0.5 wt. %, at least about 1 wt. %, at least about 2 wt. %, at least about 3 wt. %, at least about 4 wt. %, at least about 5 wt. %, at least about 6 wt. %, at least about 7 wt. %, at least about 8 wt. %, at least about 9 wt. %, at least about 10 wt. %, at least about 11 wt. %, at least about 12 wt. %, at least about 13 wt. %, at least about 14 wt. %, at least about 15 wt. %, at least about 16 wt. %, at least about 17 wt. %, at least about 18 wt. %, at least about 19 wt. %, at least about 20 wt. %, or any range or value therein between.

In some embodiments, the one or more diluents (e.g., epoxide compounds) are present in the internal phase at a concentration, by weight, relative to the total weight of the internal phase, of no greater than about 40 wt. %, no greater than about 35 wt. %, no greater than about 30 wt. %, no greater than about 25 wt. %, no greater than about 20 wt. %, no greater than about 19 wt. %, no greater than about 18 wt. %, no greater than about 17 wt. %, no greater than about 16 wt. %, no greater than about 15 wt. %, no greater than about 14 wt. %, no greater than about 13 wt. %, no greater than about 12 wt. %, no greater than about 11 wt. %, no greater than about 10 wt. %, no greater than about 9 wt. %, no greater than about 8 wt. %, no greater than about 7 wt. %, no greater than about 6 wt. %, no greater than about 5 wt. %, no greater than about 4 wt. %, no greater than about 3 wt. %, no greater than about 2 wt. %, no greater than about 1 wt. %, or any range or value therein between.

In some embodiments, the one or more diluents (e.g., epoxide compounds) are present in the internal phase at a concentration, by weight, relative to the total weight of the internal phase, of about 0.5 wt. % to about 40 wt. %, about 2 wt. % to about 30 wt. %, about 3 wt. % to about 20 wt. %, or about 3 wt. % to about 12 wt. %, or any range or value therein between.

To ensure successful encapsulation and a good barrier property of the shell after encapsulation, the epoxide compound should exhibit a high compatibility with the multifunctional monomers (e.g., acrylates) present in the internal phase, as well as a low solubility (less than about 5 wt. %, preferably insoluble) in the aqueous phase used in the microencapsulation process. In some embodiments, a salting-out agent (e.g., NaCl and/or $Na_2SO_4$) may be included in the microencapsulation process to further reduce the solubility of the epoxides in the aqueous phase.

In some embodiments, the diluent has a water solubility less than or equal to about 10.0 wt. %, less than or equal to about 5.0 wt. %, less than or equal to about 4.0 wt. %, less than or equal to about 3.0 wt. %, less than or equal to about 2.0 wt. %, less than or equal to about 1.0 wt. %, less than or equal to about 0.5 wt. %, less than or equal to about 0.4 wt. %, less than or equal to about 0.3 wt. %, less than or equal to about 0.2 wt. %, less than or equal to about 0.1 wt. %, or any range or value therein between.

In some embodiments, the diluent (e.g., an epoxide compound) has a viscosity at 25° C. of less than or equal to about 1000 cps, less than or equal to about 900 cps, less than or equal to about 800 cps, less than or equal to about 700 cps, less than or equal to about 600 cps, less than or equal to about 500 cps, less than or equal to about 400 cps, less than or equal to about 300 cps, less than or equal to about 200 cps, less than or equal to about 100 cps, less than or equal to about 90 cps, less than or equal to about 80 cps, less than or equal to about 70 cps, less than or equal to about 60 cps, less than or equal to about 50 cps, less than or equal to about 40 cps, less than or equal to about 30 cps, or any range or value therein between. In some embodiments, the viscosity of the diluent is measured using a Brookfield viscometer (Spindle S31) at 100 rpm, at room temperature.

In some embodiments, the diluent (e.g., an epoxide compound) has a weight average molecular weight of less than or equal to about 1,000 g/mol, less than or equal to about 900 g/mol, less than or equal to about 800 g/mol, less than or equal to about 700 g/mol, less than or equal to about 600 g/mol, less than or equal to about 500 g/mol, less than or equal to about 400 g/mol, less than or equal to about 300 g/mol, or any range or value therein between.

In some embodiments, the diluent has a weight average molecular weight of greater than or equal to about 200 g/mol, greater than or equal to about 250 g/mol, greater than or equal to about 300 g/mol, greater than or equal to about 350 g/mol, greater than or equal to about 400 g/mol, greater than or equal to about 450 g/mol, greater than or equal to about 500 g/mol, or any range or value therein between.

In some embodiments, the diluent has a weight average molecular weight of about 100 g/mol to about 3,000 g/mol, about 200 g/mol to about 2,000 g/mol, about 200 g/mol to about 1,000 g/mol, about 200 g/mol to about 800 g/mol, or any range or value therein.

First and Second Substrates

In some embodiments, the microcapsules are coated onto a first substrate. The first substrate may include, for example, any coated paper and/or its pigmented derivatives. In some embodiments, the first substrate is white or transparent. In some embodiments, the first substrate comprises at least one of a polyester (e.g., polyethylene terephthalate ("PET"), polyethylene naphthalate ("PEN"), etc.), a cellulose-based polymer (e.g., cellulose triacetate), a polycarbonate, a polyolefin including cyclic-polyolefin, or combinations, blends, composites, laminates, or copolymers thereof. By way of non-limiting example, the first substrate may be selected from commercially-available films including, but not limited to, HOSTAPHAN® polyester films (Mitsubishi Polyester Film), MELINEX® (DuPont Teijin Films™), and MYLAR® polyester films (DuPont Teijin Films™).

The substrate may have any suitable thickness. In some embodiments, the first substrate has a thickness of about 3 µm, about 3.5 µm, about 4 µm, about 4.5 µm, about 5 µm, about 10 µm, about 20 µm, about 30 µm, about 40 µm, about 50 µm, about 60 µm, about 70 µm, about 80 µm, about 90 µm, about 100 µm, about 150 µm, about 200 µm, about 250 µm, about 300 µm, about 350 µm, about 400 µm, about 450 µm, about 500 µm, or any range or value therein between. In some embodiments, the thickness of the first substrate is from about 12 µm to about 150 µm, or about 25 µm to about 100 µm.

In some embodiments, the developer is coated onto a second substrate. The second substrate may include, for example, any coated paper and/or their pigmented derivatives. In some embodiments, the first substrate comprises at least one of a polyester (e.g., polyethylene terephthalate ("PET"), polyethylene naphthalate ("PEN"), etc.), a cellulose-based polymer (e.g., cellulose triacetate), a polycarbonate, polyolefin including cyclic-polyolefin, or combinations, blends, composites, laminates, or copolymers thereof. By way of non-limiting example, the first substrate may comprise a commercially-available film such as HOSTAPHAN® polyester films (Mitsubishi Polyester Film), MELINEX® (DuPont Teijin Films™), and MYLAR® polyester films (DuPont Teijin Films™).

The second substrate, with developer disposed thereon, may be placed in contact with the microcapsule layer, such that the developer layer contacts the microcapsule layer. The second substrate may have any suitable thickness. In some embodiments, the second substrate has a thickness of about 3 µm, about 3.5 µm, about 4 µm, about 4.5 µm, about 5 µm, about 10 µm, about 20 µm, about 30 µm, about 40 µm, about 50 µm, about 60 µm, about 70 µm, about 80 µm, about 90 µm, about 100 µm, about 150 µm, about 200 µm, about 250 µm, about 300 µm, about 350 µm, about 400 µm, about 450 µm, about 500 µm, or any range or value therein between. In some embodiments, the thickness of the second substrate is from about 3.5 µm to about 150 µm, or about 10 µm to about 100 µm.

In some embodiments, at least one of the first and the second substrates is an opaque or white substrate. As used herein, the term "opaque" means having a total light transmittance (TLT) of less than 20%, less than 10%, less than 9%, less than 8%, less than 7%, less than 6%, less than 5%, less than 4%, less than 3%, less than 2%, or less than 1%, as measured according to ASTM D1003. The term "white substrate" means a substrate having a whiteness index of at least about 90%, at least about 92%, at least about 95%, at least about 96%, at least about 97%, at least about 98%, at least about 99%, at least about 99.5%, or greater, as measured according to ASTM E313-79. In some embodiments, the second substrate has a whiteness index of 100%, as measured by ASTM E313-79.

In some embodiments, the microcapsule layer is coated on an opaque substrate and the developer on a clear substrate. In some embodiments, the incipient light passes through the (top) developer layer and hardens the (bottom) microcapsules. After development, the leuco dye diffuses up to the developer layer and forms color images therein. The opposite configuration, with top microcapsule and bottom developer layers, may also be used, but in some embodiments with this configuration, the hardened microcapsule is slightly colored and hazy and may impart a mottled image to the viewer.

Developer Layer

In some embodiments, imaging sheets according to the present disclosure include a developer layer that is contact with the second substrate. The developer layer may be placed in contact with the microcapsule layer by for example, lamination after being applied to the second substrate. In some embodiments, the developer layer may be over-coated onto the microcapsule layer and the resultant over-coated sheet is used as is without the second substrate. In some embodiments, the over-coated developer/microcapsule sheet may be further over-coated with a durable protective coating or laminated with a second substrate, optionally with an additional adhesive layer. In some embodiments, the composition of the developer layer may be pre-mixed with the composition of the microcapsule layer and coated as a single layer onto the first substrate.

In some embodiments, the developer layer comprises one or more leuco dye developers. By way of non-limiting example, the developers may comprise Lewis acids, silicic acids, salicylic acid derivatives, benzoic acid derivatives, novolac resins, and their metal complexes, particularly zinc complexes, or blends, composites, copolymers including graft and block copolymers, or combinations thereof. For instance, the developer(s) may comprise: acid clay, zinc 3,5-bis(alpha-methylbenzyl)salicylate (e.g., N-054-W, SANKO Co., Ltd.), zinc 3,5-di-t-butyl salicylate, zinc 3,5-dioctyl salicylate, HRJ 4542 (Schenectady Chemical), or novolac resin developers such as RD9870, RD9870A, RD9880, RD9880U, RF-118, etc. (Xinxiang Richful Lube Additive Co., Ltd.).

The developer layer may have any suitable thickness. For instance, the developer layer may have a thickness of at least about 1 µm, at least about 2 µm, at least about 3 µm, at least about 4 µm, at least about 5 µm, at least about 6 µm, at least about 7 µm, at least about 8 µm, at least about 9 µm, at least about 10 µm, at least about 15 µm, at least about 20 µm, at least about 25 µm, at least about 30 µm, at least about 35 µm, at least about 40 µm, at least about 45 µm, at least about 50 µm, or any range or value therein. In some embodiments, the developer layer has a thickness from about 1 µm to about 30 µm, about 2 µm to about 20 µm, or about 3 µm to about 15 µm.

The developer may be present in the developer layer at a concentration by weight, relative to the dry weight of the developer layer, of greater than or equal to about 50 wt. %, greater than or equal to about 55 wt. %, greater than or equal to about 60 wt. %, greater than or equal to about 65 wt. %, greater than or equal to about 70 wt. %, greater than or equal to about 75 wt. %, greater than or equal to about 80 wt. %, greater than or equal to about 85 wt. %, greater than or equal to about 90 wt. %, greater than or equal to about 95 wt. %, greater than or equal to about 96 wt. %, greater than or equal to about 97 wt. %, greater than or equal to about 98 wt. %, greater than or equal to about 99 wt. %, or any range or value therein between. In some embodiments, the developer layer may comprise a polymeric binder and a filler such as silica.

Primer Layer

In some embodiments, microcapsule imaging sheets according to the present disclosure include a primer layer. The primer layer may be a film in contact with the first substrate and/or with the microcapsule layer. In some embodiments, the primer layer may comprise a polymeric binder and a white particulate. In some embodiment, the primer layer may further comprise polymeric hollow particles.

In some embodiments, the one or more polymeric binders may comprise, consist essentially of, or consist of one or more polymers selected from acrylic polymers or copolymers, styrene copolymers, butadiene copolymers, vinyl chloride copolymers, vinylidene chloride copolymers, ethylene copolymers, propylene copolymers, vinyl acetate copolymers, polyesters, polyurethanes, polylactones, polyamides, and blends or copolymers thereof. In some embodiments, the one or more polymeric binders is a latex polymer, or a blend or copolymer thereof.

In some embodiments, primer layers according to the present disclosure include one or more particulates (e.g., white particulates). The white particulates may be any suitable composition, size, and concentration for enhancing the reflectivity and/or hiding power of a primer layer.

In some embodiments, the one or more white particulates may include one or more of $TiO_2$, $BaSO_4$, $CaSO_4$, $CaCO_3$, BN, $Al_2O_3$, $Ca_3(PO_4)_2$, $ZrO_2$, ZnO, or any other suitable metal oxide, transition metal oxide, sulfate, carbonate, or phosphate material, or hydrophobic-treated derivatives thereof. In some embodiments, the white particulate is one or more selected from the group consisting of: $TiO_2$, $BaSO_4$, $CaSO_4$, $CaCO_3$, $Al_2O_3$, and $Ca_3(PO_4)_2$, and hydrophobic derivatives thereof. In some embodiments, the white particulate comprises, consists essentially of, or consists of $TiO_2$.

While the foregoing terms are believed to be well understood by one of ordinary skill in the art, the following definitions are set forth to facilitate explanation of the presently disclosed subject matter.

The term "a" or "an" may refer to one or more of that entity, i.e. can refer to plural referents. As such, the terms "a" or "an", "one or more" and "at least one" are used interchangeably herein. In addition, reference to "an element" by the indefinite article "a" or "an" does not exclude the possibility that more than one of the elements is present, unless the context clearly requires that there is one and only one of the elements.

Reference throughout this specification to "one embodiment", "an embodiment", "one aspect", or "an aspect" means that a particular feature, structure or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics can be combined in any suitable manner in one or more embodiments.

As used herein, the terms "about" or "approximately" when preceding a numerical value indicates the value plus or minus a range of 10% of the value.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the present application and relevant art and should not be interpreted in an idealized or overly formal sense unless expressly so defined herein. While not explicitly defined below, such terms should be interpreted according to their common meaning.

For purposes of the present disclosure, the term "color density" refers to a developed dye's reflective optical density or the ability to reflect light from the media sheet, as measured by a reflective Spectrodensitometer FD-5 from Konica Minolta, where the greater the light reflection of the dye, the higher the color optical density (i.e., the more intense the color). The lower the light reflection of the dye, the lower the color density (i.e., the less intense the color).

For purposes of this disclosure, the term "leuco dye" refers to a chemical dye which can alternate between two chemical forms, one of which is colorless. The transformation from the colorless leuco form to the color dye form may be reversible or irreversible and may be induced by changes in temperature, pH, irradiation, or redox state.

For purposes of this disclosure, the term "maximum color density" (or "Dmax") and "minimum color density" (or "Dmin") refers to the maximum color density achieved by a dye after a given development time as measured by a reflective Spectrodensitometer FD-5 from Konica Minolta (e.g., "Dmax, fresh" or "fresh Dmax" refers to the maximum color density of the developed image sheet as measured immediately after development, and "Dmax, t" refers to the maximum color density as measured after the developed image sheet is conditioned for a period of time, t. The term "minimum color density" (or "Dmin") refers to the minimum reflective color optical density measured in the non-image area.

For purposes of this disclosure the term "opaque" means having a total light transmittance (TLT) of less than 20%, less than 10%, less than 9%, less than 8%, less than 7%, less than 6%, less than 5%, less than 4%, less than 3%, less than 2%, or less than 1%, as measured according to ASTM D1003.

For purposes of this disclosure, the term "white substrate" means a substrate having a whiteness index of at least about 90%, at least about 92%, at least about 95%, at least about 96%, at least about 97%, at least about 98%, at least about 99%, at least about 99.5%, or greater, as measured according to ASTM E313-79. In some embodiments, the second substrate has a whiteness index of 100%, as measured by ASTM E313-79.

Compositions Comprising Microcapsules Comprising a Non-Photopolymerizable Diluent In another aspect, the present disclosure relates to compositions comprising microcapsules according to any of the embodiments discussed above. For instance, a microcapsule composition may comprise a microcapsule for a microcapsule imaging sheet, the microcapsule comprising: a polymeric shell; and an internal phase comprising a non-photopolymerizable diluent configured to react with a leuco dye developer; and a carrier, wherein the microcapsule is dispersed in the carrier. In some embodiments, the internal phase of the microcapsule further comprises a leuco dye. In some embodiments, the internal phase of the microcapsule further comprises a photoinitiator. In some embodiments, the internal phase of the microcapsule further comprises a polymerizable or crosslinkable monomer or oligomer.

In some embodiments, the microcapsule may comprise a photosensitive microcapsule comprising polymeric shell; and an internal phase comprising a leuco dye; a photoinitiator; and a polymerizable or crosslinkable monomer or oligomer. In some embodiments, the microcapsule may comprise a diluent microcapsule comprising a polymeric shell; and an internal phase comprising a non-photopolymerizable diluent configured to react with a leuco dye developer. In some embodiments, the microcapsules comprise photosensitive microcapsules, diluent microcapsules, or any combination thereof.

In some embodiments, the carrier is water. In some embodiments the carrier comprises an organic solvent, water, or any combination thereof. In some embodiments, the organic solvent is methanol, ethanol, acetone, or any other suitable solvent.

Methods of Preparing an Imaging Sheet

In another aspect, the present disclosure relates to methods of preparing an imaging sheet, comprising: contacting a first substrate with a microcapsule layer to produce a microcapsule-coated first substrate, the microcapsule layer comprising microcapsules according to any of the above-discussed embodiments. In some embodiments, the first substrate is contacted with a primer layer according to any of the above-discussed embodiments to produce a primer-coated first substrate. In some embodiments, the primer-coated first substrate is contacted with a microcapsule layer to produce a microcapsule-coated first substrate, the microcapsule layer comprising microcapsules according to any of the above-discussed embodiments.

For instance, a microcapsule layer may include a microcapsule for a microcapsule imaging sheet, the microcapsule comprising: a polymeric shell; and an internal phase comprising a non-photopolymerizable diluent configured to react with a leuco dye developer; and a carrier, wherein the microcapsule is dispersed in the carrier. In some embodiments, the internal phase of the microcapsule further comprises a leuco dye. In some embodiments, the internal phase of the microcapsule further comprises a photoinitiator. In some embodiments, the internal phase of the microcapsule further comprises a polymerizable or crosslinkable monomer or oligomer. In some embodiments, the microcapsule may comprise a photosensitive microcapsule comprising polymeric shell; and an internal phase comprising a leuco dye; a photoinitiator; and a polymerizable or crosslinkable monomer or oligomer. In some embodiments, the microcapsule may comprise a diluent microcapsule comprising a polymeric shell; and an internal phase comprising a non-photopolymerizable diluent configured to react with a leuco dye developer. In some embodiments, the microcapsules comprise photosensitive microcapsules, diluent microcapsules, or any combination thereof. In some embodiments, the microcapsules are present in a composition as disclosed above, wherein the microcapsules are dispersed in a carrier.

In some embodiments, the method of producing an imaging sheet includes contacting the microcapsule-coated first substrate with a developer layer to produce a developer-coated first substrate. In some embodiments, the developer-coated first substrate is contacted with a second substrate to produce an imaging sheet. In some embodiments, the developer layer is coated onto a second substrate to produce a developer-coated second substrate before being placed into contact with the microcapsule-coated first substrate to produce an imaging sheet. In some embodiments, the developer-coated second substrate and the microcapsule-coated first substrate are contacted with one another, such that the developer layer contacts the microcapsule layer. In some embodiments, a primer may be positioned between the second substrate and the developer layer.

Methods of Using Microcapsules and Imaging Sheets

In another aspect, which may be combined with any other aspect or embodiment, the present disclosure relates to methods of using microcapsules according to any of the above-discussed embodiments. In another aspect, which may be combined with any other aspect or embodiment, the present disclosure relates to methods of using imaging sheets according to any of the above-discussed embodiments.

For example, in some embodiments, a method of imaging or printing includes exposing an imaging sheet comprising a microcapsule according to any of the above-discussed embodiments to heat, pressure, or radiation, wherein the exposing is sufficient to release leuco dye and/or non-photopolymerizable diluent configured to react with a leuco dye developer from the polymeric shell, to produce an image.

In some embodiments, the present disclosure relates to methods of adjusting (e.g., so as to improve) one or more properties of an imaging sheet, including adding microcapsules of the present disclosure to an imaging sheet. In some embodiments, the one or more properties comprises one or more of. Dmax; fresh Dmax; Dmax, t; Dmin; image resolution; temperature latitude; dynamic range; discoloration (yellowing) resistance; and edge sharpness.

Unless explicitly indicated otherwise, all specified embodiments, features, and terms intend to include both the recited embodiment, feature, or term and equivalents thereof.

Reference will now be made in detail to some specific embodiments contemplated by the present disclosure. While various embodiments are described herein, it will be understood that it is not intended to limit the present technology to the described embodiments. On the contrary, it is intended to cover alternatives, modifications, and equivalents as may be included within the spirit and scope of the technology as defined by the appended claims.

EXAMPLES

Example 1. Effect of Non-Photopolymerizable Epoxide Compounds on Temperature Latitude, Dynamic Range, and Edge Sharpness in Microcapsule Imaging Sheets To achieve a high Dmax with fast color development and a high temperature latitude, the solubility of a leuco dye in the internal phase of a microcapsule should be high, and the viscosity of the dye solution should be as low as possible over a wide temperature range. To achieve a wide dynamic range for gray scale rendition, the viscosity of the partially crosslinked internal phase should also be as low as possible. However, a low viscosity dye solution also results in a low edge sharpness because of the high degree of dye spread, particularly in Dmax regions.

As shown in Table 1, a "conventional" internal phase comprising a mixture of two multifunctional acrylates, TMPTA/HDDA (7:3) tends to cause phase separation of typical leuco dyes within three days after solvation, at 10 phm (part per hundred monomer) and 15 phm concentrations.

TABLE 1

Solubility of Three Typical Leuco Dyes in TMPTA/HDDA (7:3)

| Leuco Dye | 10 phm Day 0 | 10 phm Day 3 | 15 phm Day 0 | 15 phm Day 3 |
|---|---|---|---|---|
| TCI (Agfa) Cyan | Cloudy | Cloudy | Cloudy | Cloudy |
| JYD Magenta | Clear | Cloudy | Clear | Cloudy |
| Yellow | Clear | Cloudy | Clear | Cloudy |

To improve the Dmax, dynamic range, and temperature latitude, low-viscosity epoxide compounds such as triglycidyl trimethylolpropane ether (TMPTGE) and DER 732 were evaluated as non-photopolymerizable reactive diluents for the internal phase of photosensitive microcapsules. Table 2 compares the viscosities of "conventional" internal phase monomers (TMPTA and HDDA) to those observed for epoxide compounds, e.g., TMPTGE (a tri-epoxide) and DER 732 (a di-epoxide).

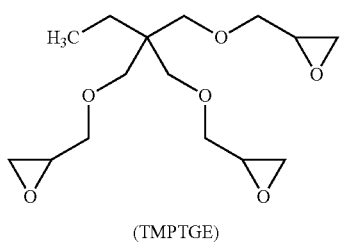

(TMPTGE)

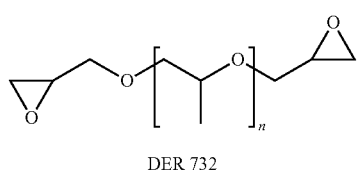

DER 732

TABLE 2

Viscosities of TMPTA, HDDA, TMPTGE, and DER 732

|  | TMPTA | HDDA | TMPTGE | DER732 |
|---|---|---|---|---|
| Viscosity (cps) (22.8° C.) | 193 | <10 | 120-180 (25° C.) | 114 |

As shown in Tables 1 and 2, it may be possible improve the solubility of leuco dyes and achieve a wide dynamic range by including epoxide compound diluents in the internal phase. It was hypothesized that color fastness and edge sharpness may also be improved by the addition of an epoxide compound into the internal phase, presumably via: (1) the reaction of the epoxide with the carboxylic group of the developed (ring-opened) leuco dyes to reduce the risk of ring closure of the dye which reverse the dye back to leuco dye; and/or (2) the reaction of the epoxide with the novolac resin of the developer, to crosslink the developer resin and reduce the rate of dye spreading.

Example 2. Effect of Multifunctional Epoxides on the Temperature Latitude of Photosensitive Microcapsule Imaging Media Green-sensitive imaging sheets were prepared according to the formulations and processes described below:

TABLE 3

List of Materials Used

| Chemical Name | Description |
|---|---|
| Versa TL502 | Sulfonated polystyrene from Nouryon Corp. |
| CYMEL ® 385 | Methylated high imino melamine resin with a low degree of alkylation from Allnex Corp. |
| ESBO | Epoxidized soybean oil from Merck |
| EP-4221 | 3,4-Epoxycyclohexylmethyl 3,4-epoxycyclohexanecarboxylate from Chembridge International Corp. |
| EP-3510 | 1,2-Cyclohexanedicarboxylic Acid Diglycidyl Ester from Chembridge International Corp. |
| ERISYS ® GE-30 | Triglycidyl trimethylolpropane ether from CVC Thermoset Specialties |
| DESMODUR ® N 100 | Aliphatic polyisocyanate from Covestro Corp. |
| AEROSOL ™ OT | Sodium bis (2-ethylhexyl) sulfosuccinate surfactant from Cytec Corp. |
| TRITON ™ X-114 | Nonionic surfactant from Dow Corp. |
| IRGANOX ® 1035 | Phenolic antioxidant and heat stabilizer from BASF |
| GSB1202 | Spacer particle from Guidewin Corp. ($D_{50}$ = 11.44 □m) |
| CELLOSIZE ™ QP-52000H | Hydroxyethyl cellulose from Dow Corp. |
| SILWET ® L-7001 | Silicone surfactant from Momentive Performance Materials |
| SILWET ® L-7604 | Silicone surfactant from Momentive Performance Materials |
| JONCRYL ® 7256 | Latex binder from BASF |
| TAMOL ™ 731 DP | A hydrophobic copolymer dispersant from Dow Corp. |
| TAMANOL 586 | Alkylphenolic resin from Arakawa Chemical Industries |
| PVA2488 | Polyvinyl alcohol from Sinochem Corp. |
| PVA205 | Polyvinyl alcohol from Sinochem Corp. |
| CAB-O-SPERSE ® 1015A | An aqueous dispersion of CAB-O-SIL ® L-90 (fumed silica) from Cabot Corp. |
| CAB-O-SPERSE ® 2012A | An aqueous dispersion of CAB-O-SIL ® M-5 (fumed silica) from Cabot Corp. |
| TMPTA | Trimethylolpropane triacrylate from Sartomer |
| HDDA | Hexanediol diacrylate from Aldrich |
| TPGDA | Tripropylene glycol diacrylate from Aldrich |
| DER 732 | Poly(propylene glycol) diglycidyl ether from Dow |
| DBTDL | Dibutyltin dilaurate from Aldrich |
| Magenta Leuco Dye | CAS: 50292-95-0 from Synmedia-chem |

Microencapsulation Process for Preparation of Photosensitive Microcapsules

Photosensitive microcapsules were prepared using materials in Table 3, according to the following procedure:

1. Into a stainless steel beaker, 220 parts of water and 8 parts of Versa TL502 sulfonated polystyrene (dry) were added and thoroughly mixed.
2. 10 parts of pectin (polygalacturonic acid methyl ester) was slowly sifted into the mixture and stirred overnight at room temperature (500-1000 rpm).
3. The pH was adjusted to 7.5 with 10% sodium carbonate, and the mixing speed was increased to 1750 rpm.

4. The internal phase as shown in Table 4 was added over a period of 15-30 seconds, the resultant mixture was stirred for 30 minutes, and 11 parts of a 9.1% aqueous solution (pH adjusted 7.0) of DETA (diethylene triamine) were added and allowed to react for 30 minutes at 25° C., followed by an hour at 40° C.
5. A solution comprising 19.9 parts of CYMEL® 385 and 40 parts of water (pH adjusted to 6.0) was added, and the mixture was allowed to react at 70° C. for an additional 2 hours.
6. 15.23 parts of a 34.3% aqueous of sodium sulfate were added, and the mixture was stirred for 10 minutes, 1.97 parts of CYMEL® 385 and 10 parts of water were added, and the mixture was allowed to react at 70° C. for an additional 1 hour.
7. The mixing speed was reduced to 600 rpm, the pH was adjusted to 9.5 using a 20% NaOH solution, and the resultant reaction mixture was stirred overnight at room temperature.

TABLE 4

Internal Phase of Green Sensitive Microcapsule (Example 2)

| Green Sensitive Capsule Compositions (Dry Parts) | Example 2-1 | Example 2-2 | Example 2-3 | Example 2-4 | Example 2-5 |
|---|---|---|---|---|---|
| TMPTA (trimethylolpropane triacrylate) | 70.0 | 63.0 | 63.0 | 63.0 | 63.0 |
| HDDA (hexanediol diacrylate) | 30.0 | 27.0 | 27.0 | 27.0 | 27.0 |
| TPGDA (Tripropylene glycol diacrylate) | 0.0 | 10.0 | 8.0 | 7.0 | 0.0 |
| DER 732 (diepoxide) | 0.0 | 0.0 | 2.0 | 3.0 | 10.0 |
| Magenta Leuco Dye (CAS: 50292-95-0) | | | 15.0 | | |
| THEED (N,N,N',N'-tetrakis(2-hydroxyethyl)ethylenediamine) | | | 0.2 | | |
| DIDMA (2,6-diisopropyl-N,N-dimethylaniline) | | | 3.0 | | |
| (MTBS) mercaptobenzothiazole disulfide | | | 0.5 | | |
| Green-sensitive photoinitiator (1-heptyl-2-[3-(1-heptyl-3,3-dimethyl-1,3-dihydro-2H-indol-2-ylidene)-propenyl]-3,3-dimethyl-3H-indolium isobutyl triphenyl borate) | | | 0.075 | | |
| DESMODUR® N 100 | | | 8.0 | | |
| DBTDL (dibutyltin dilaurate) | | | 0.05 | | |

Preparation of Control Microcapsule Sheet—Microcapsule Coatings on PET (MELINEXR 339)

The coating fluid as shown in Table 5 was adjusted to 33 wt. % solid by water and dispersed thoroughly using a low shear mixer and coated on a 2-mil. white PET (MELINEX® 339) substrate with a Myrad bar and dried in an 80° C. oven for 10 minutes. The dry coating thickness was about 8 microns, as measured by a Mitutoyo thickness gauge.

TABLE 5

Compositions of Microcapsule Fluids (Example 2)

| Ingredients | Dry parts |
|---|---|
| Green-sensitive microcapsule (45% solid) | 100.0 |
| Calcium Carbonate (33% solid) ($D_{50}$ = 0.12 um) | 5.0 |
| CELLOSIZE ™ QP-52000H | 0.5 |
| AEROSOL ™ OT | 0.1 |
| TRITON ™ X-114 | 0.2 |
| SILWET® L*-7001 | 0.2 |
| SILWET® L*-7604 | 0.2 |
| TAMOL ™ 731 DP | 2.0 |
| JONCRYL® FLX 5040 | 10.0 |
| Eastman AQ ™ 55S | 8.0 |

Preparation of Color Developer Coatings

The developer composition as shown in Table 6 was coated on a 1-mil. transparent PET film with a Myrad bar and dried in an 80° C. oven for 10 minutes with a target dry coating thickness of about 7 μm.

TABLE 6

Composition of Developer Coating (Example 2)

| Ingredient | Dry parts |
|---|---|
| Resin Developer RD9870A (Richful, China) | 98.00 |
| CAB-O-SPERSE® 1015A (Cabot, USA) | 0.86 |
| PVA1799 (Sinochem, China) | 1.14 |

Preparation and Development of Image Sheets (Example 2)

The microcapsule and the developer films thus prepared were laminated together with a Tamerica roll laminator TCC2700 with the temperature, pressure and speed settings of 100° C., 3.621 Kgf/170 mm and 0.368 m/min, respectively to form various photosensitive imaging sheets. The prepared media were developed with a pressure development fixture at 80° C. and the Dmax and Dmin as measured by a reflective Spectrodensitometer FD-5 from Konica Minolta.

TABLE 7

Effect of Epoxide Compounds on the Temperature Latitude of Green Sensitive Microcapsules

| Example 2 (Comprising 15.0 Parts of Magenta Leuco Dye) | | 2-1 | 2-2 | 2-3 | 2-4 | 2-5 |
|---|---|---|---|---|---|---|
| Multifunctional | TMPTA | 70.0 | 63.0 | 63.0 | 63.0 | 63.0 |
| Monomer (Parts) | HDDA | 30.0 | 27.0 | 27.0 | 27.0 | 27.0 |
| Reactive Epoxide | TMPTGE | 0.0 | 10.0 | 8.0 | 7.0 | 0.0 |
| Diluent (Parts) | DER732 | 0.0 | 0.0 | 2.0 | 3.0 | 10.0 |
| Media Room | Dmin (Fresh) | 0.09 | 0.15 | 0.09 | 0.08 | 0.26 |
| Storage Temp. | Dmax (Fresh) | 0.38 | 0.50 | 0.44 | 0.46 | 0.48 |
| Condition | Dmax (80° C., 10 min) | 0.68 | 1.02 | 0.78 | 0.97 | 0.81 |
| 4° C., | Dmax (Fresh) | 0.34 | 0.41 | 0.42 | 0.46 | 0.47 |
| Overnight | Dmax (80° C., 10 min) | 0.69 | 0.95 | 0.71 | 0.94 | 0.74 |
| −10° C., | Dmax, Fresh | 0.34 | 0.44 | 0.44 | 0.49 | 0.41 |
| Overnight | Dmax (80° C., 10 min) | 0.71 | 0.82 | 0.67 | 0.82 | 0.55 |

As shown in Table 7, the Dmax data reveals that the Dmax (both freshly developed and post-heated at 80° C. for 10 min.) and the temperature latitude of the microcapsules comprising epoxide diluents (Example 2-2 to Example 2-5) are generally better than the control capsules (Example 2-1) containing only acrylic monomers TMPTA/HDDA (7:3). The microcapsule layers containing microcapsules of Example 2-2, comprising TMPTA/HDDA/TMPTGE (63/27/10) in the internal phase, appears to offer the highest Dmax and the best temperature latitude of the internal phases tested and maintains about 93.1% and 80.4% of its Dmax (80° C., 10 min) after storage overnight at 4° C. and −10° C., respectively. In fact, for this internal phase, even the low temperature Dmax values are about 20% (−10° C. conditioned) to about 40% (4° C. conditioned) better than the room temperature Dmax of the control samples (Example 2-1), which do not contain TMPTGE or DER732.

As also evident from Table 7, the microcapsules containing the highest concentration of DER 732 in the internal phase (Example 2-5) appears to result in a higher Dmin in the non-image area although those containing a lower concentration of DER 732 showed a slightly lower Dmin. Without being bound to any particular theory, it is possible that the incorporating an epoxide diluent improved the solubility of the leuco dyes in the internal phase, even at temperature as low as −10° C. The viscosity of the resultant internal phase was also reduced. As a result, both the rate of the color development, as indicated by the fresh Dmax, and temperature latitude, as indicated by Dmax after low-temperature storage, were significantly improved. However, the presence of too high a concentration of the low molecular weight epoxide DER 732 in the internal phase (Example 2-5) might cause deterioration of the barrier properties of the microcapsule shell via one or more mechanisms, including plasticization of the shell, interference of the interfacial polymerization/crosslinking shell formation process, and micropore formation in the shell. As a result, Example 2-5 exhibits an exceptionally high Dmin.

Example 3: Preparation of Microcapsule Imaging Systems Comprising a Photosensitive Microcapsule and a Non-Photosensitive Microcapsule Comprising Multifunctional Epoxides Preparation of Photosensitive Microcapsules To test the effect of incorporating photosensitive and non-photosensitive microcapsules comprising multifunctional epoxides in the same microcapsule imaging system, compositions and processes of Example 2 were used, except that the internal phase of Table 8 was used for microencapsulation.

TABLE 8

Internal Phase of Green Sensitive Microcapsules of Example 3

| Ingredient | Dry Parts |
|---|---|
| TMPTA (trimethylolpropane triacrylate) | 90.0 |
| TPGDA (tripropylene glycol diacrylate) | 10.0 |
| THEED (N,N,N',N'-tetrakis(2-hydroxyethyl)ethylenediamine) | 0.2 |
| DIDMA (2,6-diisopropyl-N,N-dimethylaniline) | 3.0 |
| Magenta Leuco Dye (CAS: 50292-95-0 from Synmedia-chem) | 20.00 |
| (MTBS) mercaptobenzothiazole disulfide | 0.50 |
| Green-sensitive photoinitiator (1-heptyl-2-[3-(1-heptyl-3,3-dimethyl-1,3-dihydro-2H-indol-2-ylidene)-propenyl]-3,3-dimethyl-3H-indolium isobutyl triphenyl borate) | 0.075 |
| DESMODUR ® N 100 | 8.00 |
| DBTDL (dibutyltin dilaurate) | 0.05 |

Preparation of Non-Photosensitive Microcapsules of Epoxide Diluents (Example 3)

Non-photosensitive microcapsules comprising a polymer shell and an internal phase including one or more epoxide compounds were prepared according to the procedure used above for photosensitive microcapsules, except the 1.97 parts of CYMEL® 385 and 10 parts of water in step 6 were omitted, and the internal phase of the microcapsules (step 4) was replaced with the compositions (3A-3D) shown in Table 9 below.

TABLE 9

Internal Phase Compositions for Non-photosensitive Microcapsules Including Epoxide Compounds (in dry parts)

| Ingredient | Epoxide Capsule 3A | Epoxide Capsule 3B | Epoxide Capsule 3C | Epoxide Capsule 3D |
|---|---|---|---|---|
| ESBO | 100.00 | 20.00 | — | — |
| ERISYS ® GE-30 | — | 80.00 | — | — |
| EP-4221 | — | — | 100.00 | — |
| EP-3510 | — | — | — | 100.00 |
| IRGANOX ® 1035 | 0.10 | 0.10 | 0.10 | 0.10 |
| DESMODUR ® N 100 | 8.00 | 8.00 | 8.00 | 8.00 |
| DBTDL | 0.05 | 0.05 | 0.05 | 0.05 |

Particle Size of Photosensitive and Non-Photosensitive Microcapsules (Example 3)

All photosensitive and non-photosensitive microcapsules prepared according to the methods above were washed extensively with water and were centrifuged to remove excess water-soluble polymers and additives present in the aqueous phase. Microcapsule size distributions (Table 10) were measured using a HORIBA Partica LA-960 laser scattering particle size distribution analyzer. As indicated in Table 10, all microcapsules examined were of comparable particle size and particle size distribution.

TABLE 10

Size Distributions for Microcapsules (Example 3)

| Microcapsule Type | $D_{10}$ (μm) | $D_{50}$ (μm) | $D_{90}$ (μm) |
|---|---|---|---|
| Green Photosensitive Microcapsule 3 (Control) | 4.41 | 6.74 | 10.18 |
| Epoxide Capsule 3A | 4.11 | 6.49 | 10.00 |
| Epoxide Capsule 3B | 5.65 | 8.75 | 13.13 |
| Epoxide Capsule 3C | 4.75 | 7.19 | 10.87 |
| Epoxide Capsule 3D | 5.29 | 8.21 | 12.53 |

Preparation of Microcapsule Coatings

Table 11 shows the compositions of microcapsule stock fluids of the green sensitive microcapsules (Microcapsule 3, the control) and 4 diluent microcapsules comprising epoxide compounds (Microcapsules 3A-3D). Microcapsule coatings comprising various types and concentrations of the epoxide microcapsules were prepared by mixing the control fluid containing Microcapsule 3 with various concentrations of fluids containing Microcapsules 3A-3D. Each coating fluid was adjusted to 30 wt. % solids by addition of water before being coated on a 2-mil white PET (MELINEX® 339) substrate using a Myrad bar. The coated substrates were then dried in an oven at 80° C. for 10 minutes with a target dry coating thickness of about 8 μm, as measured by a Mitutoyo thickness gauge.

TABLE 11

Compositions of Microcapsule Fluids

| Ingredients (Dry Parts) | Fluid 3 (Control) | Fluid 3A | Fluid 3B | Fluid 3C | Fluid 3D |
|---|---|---|---|---|---|
| Green Sensitive Microcapsule 3 (35% solid) | 100.0 | — | — | — | — |
| Epoxide Capsule 3A (35% solid) | — | 100.0 | — | — | — |
| Epoxide Capsule 3B (35% solid) | — | — | 100.0 | — | — |
| Epoxide Capsule 3C (35% solid) | — | — | — | 100.0 | — |
| Epoxide Capsule 3D (35% solid) | — | — | — | — | 100.0 |
| GSB1202* Dispersion | 2.5 | | | | |
| CaCO₃ (33% solid, $D_{50}$ = 0.12 μm) | 5.0 | | | | |
| CELLOSIZE ™ QP-52000H | 0.71 | | | | |
| AEROSOL ™ OT | 0.05 | | | | |
| TRITON ™ X-114 | 0.05 | | | | |
| SILWETR L*-7001 | 0.2 | | | | |
| SILWETR L*-7604 | 0.2 | | | | |
| TAMOL ™ 731 DP | 2.0 | | | | |
| JONCRYL ® 7256 | 9.0 | | | | |

Preparation of Color Developer Coatings and Imaging Sheets

The same developer coating as that used in Example 2 was prepared, except that the dry coating thickness was about 9 μm, as measured by a Mitutoyo thickness gauge.

To prepare imaging sheets comprising photosensitive microcapsules and non-photosensitive epoxide microcapsules, the microcapsule films and the developer films prepared according to the above procedures were laminated together with a Tamerica roll laminator TCC2700 with temperature, pressure, and speed settings of 100° C., 3.621 Kgf/170 mm, and 0.368 m/min, respectively, to form various imaging sheets (Control; 3A1-3A8, Table 12; 3B1-3B8, Table 13; 3C1-3C8, Table 14; and 31D1-31D8, Table 15).

The color development properties of the various imaging sheets were determined by exposing the imaging sheets through a Kodak Q60 mask with a white-light LED exposure unit for 1 sec at 9.5 mW/cm² and developing the image sheet using a pressure fixture. The results are shown in Tables 12-15 below.

For each exposed imaging sheet, the various properties reported in Tables 12-15 are defined as follows:

$E_{10}$: energy required to reduce Dmax by 10%

$E_{90}$: energy required to reduce Dmax by 90%

Dmin, $_M$: the average (magenta) color density in the fully exposed area measured immediately after exposure, pressure development and post-heating through a heating roller at 100° C.

Aged Dmin, $_M$: the Dmin, M after conditioning in an environmental chamber (40° C./85% RH) for 2 days Dmax, $_M$: the average (magenta) density achieved in the non-exposed area measured immediately after exposure, pressure development and post-heating through a heat roller at 100° C.

Normalized Dmax, $_M$=Dmax, $_M$/(fraction of the control capsule used)

ΔY (yellow discoloration): the increase in the yellow color density after the samples were conditioned in a 40° C./85% RH chamber for 2 days followed by exposure in a white lightbox (37,000 lux) for 7 days.

Peeling strength: the average delamination force (180°) of the Dmax area (the unexposed area).

For all imaging sheets, the Dmin, $_M$, Dmax, $_M$, and ΔY were measured by Spectrodensitometer FD-5 (Konica Minolta). The peel strength in Dmax area (25.4 mm width) was measured with an Instron Peel Tester, Model 3367 at a peeling rate of 30 mm/min, after the developed samples were conditioned at ambient conditions for 4 days.

TABLE 12

Imaging Sheet Performance as a Function of Microcapsule 3A (ESBO) Content

| Example | Epoxide Capsule 3A (%) | $E_{10}$ (mJ/cm$^2$) | $E_{90}$ (mJ/cm$^2$) | Dmin, $_M$ | Aged Dmin, $_M$ | Dmax, $_M$ | Normalized Dmax, $_M$ | Δ Y | Peeling Strength (N/25 mm) |
|---|---|---|---|---|---|---|---|---|---|
| Control | 0% | 0.14 | 0.28 | 0.04 | 0.11 | 1.97 | 1.97 | 0.29 | 0.062 |
| 3A1 | 2% | 0.11 | 0.27 | 0.03 | 0.12 | 1.93 | 1.97 | 0.25 | 0.079 |
| 3A2 | 4% | 0.10 | 0.28 | 0.03 | 0.11 | 2.00 | 2.08 | 0.15 | 0.087 |
| 3A3 | 6% | 0.10 | 0.28 | 0.03 | 0.10 | 2.03 | 2.16 | 0.17 | 0.097 |
| 3A4 | 8% | 0.11 | 0.30 | 0.04 | 0.11 | 1.97 | 2.14 | 0.15 | 0.076 |
| 3A5 | 10% | 0.11 | 0.30 | 0.04 | 0.11 | 1.99 | 2.21 | 0.13 | 0.087 |
| 3A6 | 12% | 0.11 | 0.30 | 0.03 | 0.10 | 1.87 | 2.13 | 0.14 | 0.105 |
| 3A7 | 14% | 0.11 | 0.29 | 0.04 | 0.08 | 1.75 | 2.03 | 0.21 | 0.080 |
| 3A8 | 16% | 0.10 | 0.30 | 0.04 | 0.10 | 1.88 | 2.24 | 0.14 | 0.067 |

TABLE 13

Imaging Sheet Performance as a Function of Microcapsule 3B (ESBO:ERISYS ® GE-30 = 20:80) Content

| Example | Epoxide Capsule 3B (%) | $E_{10}$ (mJ/cm$^2$) | $E_{90}$ (mJ/cm$^2$) | Dmin, $_M$ | Aged Dmin, $_M$ | Dmax, $_M$ | Normalized Dmax, $_M$ | Δ Y | Peeling Strength (N/25 mm) |
|---|---|---|---|---|---|---|---|---|---|
| Control | 0% | 0.14 | 0.28 | 0.04 | 0.11 | 1.97 | 1.97 | 0.29 | 0.062 |
| 3B1 | 2% | 0.10 | 0.25 | 0.03 | 0.12 | 1.82 | 1.86 | 0.20 | — |
| 3B2 | 4% | 0.11 | 0.30 | 0.02 | 0.07 | 1.79 | 1.86 | 0.19 | — |
| 3B3 | 6% | 0.11 | 0.30 | 0.02 | 0.08 | 1.92 | 2.04 | 0.19 | 0.065 |
| 3B4 | 8% | 0.12 | 0.30 | 0.02 | 0.10 | 1.82 | 1.98 | 0.19 | — |
| 3B5 | 10% | 0.11 | 0.30 | 0.02 | 0.07 | 1.78 | 1.98 | 0.19 | 0.110 |
| 3B6 | 12% | 0.11 | 0.29 | 0.03 | 0.07 | 1.76 | 2.00 | 0.18 | 0.117 |
| 3B7 | 14% | 0.10 | 0.28 | 0.02 | 0.06 | 1.81 | 2.10 | 0.20 | — |
| 3B8 | 16% | 0.11 | 0.27 | 0.03 | 0.07 | 1.90 | 2.26 | 0.22 | — |

TABLE 14

Imaging Sheet Performance as a Function of Microcapsule 3C (EP-4221) Content

| Example | Epoxide Capsule 3C (%) | $E_{10}$ (mJ/cm$^2$) | $E_{90}$ (mJ/cm$^2$) | Dmin, $_M$ | Aged Dmin, $_M$ | Dmax, $_M$ | Normalized Dmax, $_M$ | Δ Y | Peeling Strength (N/25 mm) |
|---|---|---|---|---|---|---|---|---|---|
| Control | 0% | 0.14 | 0.28 | 0.04 | 0.11 | 1.97 | 1.97 | 0.29 | 0.062 |
| 3C1 | 2% | 0.10 | 0.31 | 0.04 | 0.12 | 1.97 | 1.97 | 0.22 | — |
| 3C2 | 4% | 0.10 | 0.28 | 0.02 | 0.08 | 1.84 | 1.88 | 0.22 | 0.065 |
| 3C3 | 6% | 0.09 | 0.25 | 0.02 | 0.10 | 1.70 | 1.77 | 0.23 | 0.067 |
| 3C4 | 8% | 0.10 | 0.23 | 0.03 | 0.11 | 1.76 | 1.87 | 0.24 | — |
| 3C4 | 10% | 0.10 | 0.22 | 0.03 | 0.09 | 1.69 | 1.84 | 0.21 | 0.068 |
| 3C6 | 12% | 0.10 | 0.22 | 0.02 | 0.10 | 1.72 | 1.91 | 0.23 | 0.063 |
| 3C7 | 14% | 0.10 | 0.22 | 0.03 | 0.13 | 1.67 | 1.90 | 0.22 | — |
| 3C8 | 16% | 0.10 | 0.21 | 0.03 | 0.11 | 1.67 | 1.94 | 0.19 | — |

TABLE 15

Imaging Sheet Performance as a Function of Microcapsule 3D (EP-3510) Content

| Example | Epoxide Capsule 3D (%) | $E_{10}$ (mJ/cm$^2$) | $E_{90}$ (mJ/cm$^2$) | Dmin, $_M$ | Aged Dmin, $_M$ | Dmax, $_M$ | Normalized Dmax, $_M$ | Δ Y | Peeling Strength (N/25 mm) |
|---|---|---|---|---|---|---|---|---|---|
| Control | 0% | 0.14 | 0.28 | 0.04 | 0.11 | 1.97 | 1.97 | 0.29 | 0.062 |
| 3D1 | 2% | 0.11 | 0.30 | 0.03 | 0.10 | 1.97 | 2.01 | 0.15 | 0.082 |
| 3D2 | 4% | 0.11 | 0.29 | 0.02 | 0.09 | 1.84 | 1.92 | 0.18 | 0.097 |
| 3D3 | 6% | 0.11 | 0.27 | 0.03 | 0.09 | 1.83 | 1.95 | 0.12 | 0.107 |
| 3D4 | 8% | 0.11 | 0.25 | 0.03 | 0.08 | 1.85 | 2.01 | 0.14 | 0.093 |

TABLE 15-continued

Imaging Sheet Performance as a Function of Microcapsule 3D (EP-3510) Content

| Example | Epoxide Capsule 3D (%) | $E_{10}$ (mJ/cm$^2$) | $E_{90}$ (mJ/cm$^2$) | Dmin, $_M$ | Aged Dmin, $_M$ | Dmax, $_M$ | Normalized Dmax, $_M$ | $\Delta Y$ | Peeling Strength (N/25 mm) |
|---|---|---|---|---|---|---|---|---|---|
| 3D5 | 10% | 0.11 | 0.23 | 0.03 | 0.10 | 1.99 | 2.21 | 0.14 | 0.098 |
| 3D6 | 12% | 0.10 | 0.23 | 0.03 | 0.11 | 1.92 | 2.18 | 0.15 | 0.098 |
| 3D7 | 14% | 0.10 | 0.22 | 0.03 | 0.08 | 1.80 | 2.09 | 0.25 | 0.125 |
| 3D8 | 16% | 0.11 | 0.22 | 0.03 | 0.08 | 1.62 | 1.93 | 0.15 | 0.110 |

As shown in Table 12, incorporating a higher concentration of non-photosensitive epoxide-containing microcapsules 3A (2% up to 16%) decreases the yellow discoloration ($\Delta Y$) by approximately 50% (from 0.29 to 0.13) and increases the delamination resistance (peeling strength) by about 69% (from 0.062 to 1.05 N/25 mm). In contrast, the photosensitivity, the $E_{10}$ and $E_{90}$, and the maximum (Dmax, M) and minimum (Dmin, M) color density achievable in the non-exposed and fully exposed areas, respectively, remained essentially unchanged, regardless of the microcapsule 3A concentration. In fact, the normalized Dmax (normalized by the actual dye loading), an indication of the coloring power of the leuco dye used, increases with the addition of the ESPO microcapsules 3A.

These phenomena are also observed for Microcapsule 3B. As shown in Table 13, addition of Microcapsule 3B (2% to 16%) improves peeling strength and coloring power of the leuco dye, while reducing the yellow discoloration. Additionally, some unexpected improvements in photosensitivity ($E_{10}$ and $E_{90}$) were observed with addition of Microcapsule 3B. Similarly, Tables 14 and 15 show that increased concentration of Microcapsules 3C and 3D, respectively, cause improvements in peeling strength, increased photosensitivity ($E_{10}$ and $E_{90}$), and reduced yellow discoloration ($\Delta Y$).

Without being bound to any particular theory, it is believed that after its pressure-induced release from the microcapsule, the epoxide compound reacts with and cross-links the phenolic groups in the developer layer, significantly improving the peeling force and reducing the yellow discoloration ($\Delta Y$). The epoxide compound also acts as a solvent or diluent to improve the diffusion of the dyes into the developer layer, causing an increase in the normalized Dmax, or the coloring efficiency, of the leuco dye.

Example 4. Preparation of Microcapsule Imaging Systems Comprising a Photosensitive Microcapsule Comprising a Multifunctional Epoxide in the Internal Phase Preparation of Photosensitive Microcapsules Including a Multifunctional Epoxide in the Internal Phase and Imaging Sheets Comprising the Same Photosensitive microcapsules comprising epoxidized soybean oil in the internal phase were prepared by the same microencapsulation process for preparing green photosensitive microcapsules as that discussed in Example 2, except that the internal phase shown in Table 5 was replaced with those shown in Table 16 (for Microcapsules 4-1 and 4-2).

TABLE 16

Composition of Internal Phase for Photosensitive Epoxide-Containing Microcapsules

| Ingredient (Dry Parts) | Microcapsule 4-1 | Microcapsule 4-2 |
|---|---|---|
| TMPTA (trimethylolpropane triacrylate) | 85.5 | 81.0 |
| TPGDA (tripropylene glycol diacrylate) | 9.5 | 9.0 |
| Epoxidized Soybean Oil | 5.0 | 10.0 |
| THEED (N,N,N',N'-tetrakis(2-hydroxyethyl)ethylenediamine) | 0.20 | 0.20 |
| DIDMA (2,6-diisopropyl-N,N-dimethylaniline) | 3.0 | 3.0 |
| Magenta Leuco Dye (CAS: 50292-95-0 from Synmediachem) | 20.0 | 20.0 |
| (MTBS) mercaptobenzothiazole disulfide | 0.50 | 0.50 |
| Green-sensitive photoinitiator (1-heptyl-2-[3-(1-heptyl-3,3-dimethyl-1,3-dihydro-2H-indol-2-ylidene)-propenyl]-3,3-dimethyl-3H-indolium isobutyl triphenyl borate) | 0.075 | 0.075 |
| DESMODUR® N 100 | 8.0 | 8.0 |
| DBTDL (dibutyltin dilaurate) | 0.05 | 0.05 |

The microcapsules thus prepared were washed extensively with water and were centrifuged to remove excess water-soluble polymers and additives present in the aqueous phase. The particle sizes ($D_{50}$) of the purified/washed microcapsules, measured using a HORIBA LA-960 Particle Size Analyzer, were 6.44 µm and 5.42 µm for Microcapsules 4-1 and 4-2, respectively.

Imaging sheets comprising the photosensitive microcapsules 4-1 and 4-2 were prepared by laminating the microcapsule coating compositions shown in Table 17 below with the developer coating composition shown in Table 6. The solid content of all the microcapsule fluids were adjusted to 30 wt. % solids by adding water before being coated onto a 2-mil white PET (MELINEX® 339) substrate with a Myrad bar, then were dried in an 80° C. oven for 10 minutes with a target dry coating thickness of about 8 µm as measured by a Mitutoyo thickness gauge.

TABLE 17

Microcapsule Coating Fluid Compositions for
Photosensitive Microcapsules 4-1 and 4-2

| Ingredient | Microcapsule Fluid 4-1 or 4-2 (dry parts) |
|---|---|
| Green Photosensitive Microcapsule 4-1 or 4-2 (35% solid) | 100.00 |
| GSB1202 (50% solid) (particle size, $D_{50}$ = 11.44 μm) | 2.50 |
| $CaCO_3$ (33% solid) (particle size, $D_{50}$ = 0.12 μm) | 5.00 |
| CELLOSIZE ™ QP-52000H | 0.71 |
| AEROSOL ™ OT | 0.05 |
| TRITON ™ X-114 | 0.05 |
| SILWET ® L*-7001 | 0.20 |
| SILWET ® L*-7604 | 0.20 |
| TAMOL ™ 731 DP | 2.00 |

The imaging sheets were exposed through a Kodak Q60 mask with a white-light LED exposure unit for 1 sec at 9.5 mW/cm² and were developed by a pressure fixture. The results are shown in Table 18.

TABLE 18

Imaging Sheet Performance as a Function of ESBO
Content in Photosensitive Microcapsules

| Example | Wt. % of Multifunctional Acrylates Replaced by ESBO | $E_{10}$ (mJ/cm²) | $E_{90}$ (mJ/cm²) | ΔY | Peeling Strength (N/25 mm) |
|---|---|---|---|---|---|
| Control (from Example 3) | 0% | 0.14 | 0.28 | 0.29 | 0.062 |
| 4-1 | 5% | 0.10 | 0.37 | 0.10 | 0.067 |
| 4-2 | 10% | 0.13 | 0.43 | 0.18 | 0.116 |

As shown in Table 18, the replacement of about 5% to about 10% (by weight) of the multifunctional acrylates in the internal phase with the non-photosensitive reactive diluent ESBO resulted in a significant decrease in yellow discoloration after aging, as well as an increase in peeling strength of the laminated image sheets. Unlike the examples of Microcapsules 3A-3D, in which multifunctional epoxides were encapsulated separately in non-photosensitive microcapsules rather than in photosensitive microcapsules, Microcapsules 4-1 and 4-2 show a decrease in $E_{10}$ (the energy required to reduce image optical density (OD) by 10%) and an increase in dynamic range ($E_{90}$-$E_{10}$). Accordingly, images of a higher on-set photosensitivity as well as a wider grayscale may be achieved by using about 5% to about 10% of the diluent ESBO.

Without being bound by any particular theory, the presence of the non-photosensitive diluent ESBO might effectively reduce the viscosity of the internal phase (and the cage effect), affording a higher quantum efficiency of the photoinitiator or auto-oxidizer/oxygen scavenger—and in turn, a lower $E_{10}$. Further, the presence of ESBO also effectively reduces the gel effect and increases the solubility of the leuco dyes in the internal phase, particularly at the later stage of photopolymerization/crosslinking. The enhanced solubility affords an increase in the $E_{90}$ (the energy required to reduce the image OD by 90%) and a wider dynamic range for grayscale rendition.

The exposure temperature latitude of the imaging sheets of Examples 4-1 (5 wt. % ESBO) and 4-2 (10 wt. % ESBO) are shown in Table 19. The imaging sheets were sealed in aluminized PET barrier bags and conditioned for 64 hours at room temperature, 1.5° C., and −26° C. The aged imaging sheets were then re-conditioned at room temperature for about 10 minutes and exposed through a Kodak Q60 mask with a white-light LED exposure unit (9.5 mW/cm²) for 1 sec and were developed immediately by a pressure fixture. The resulting magenta Dmax was measured immediately after development.

TABLE 19

Temperature Latitude as a Function of ESBO
Content in Photosensitive Microcapsules

| Example | ESBO in Internal Phase (wt. %) | Aging Conditions | % ΔDmax (Magenta) After Aging[1] | % Δ$E_{90}$ After Aging[2] |
|---|---|---|---|---|
| Control | 0 | RT | — | — |
| | | 1.5° C., 64 hr | −16.70% | 82.10% |
| | | −26° C., 64 hr | −14.70% | 89.20% |
| 4-1 | 5 | RT | — | — |
| | | 1.5° C., 64 hr | −8.20% | 2.70% |
| | | −26° C., 64 hr | −8.70% | 40.50% |
| 4-2 | 10 | RT | — | — |
| | | 1.5° C., 64 hr | −7.50% | 41.80% |
| | | −26° C., 64 hr | −5.40% | 58.10% |

[1] % ΔDmax after aging = [(Dmax, RT − Dmax, aged)/Dmax, RT] × 100
[2] % Δ$E_{90}$ = [($E_{90, aged}$ − $E_{90, RT}$)/$E_{90, RT}$] × 100; $E_{90}$ = exposure energy required to lose 90% of Dmax.

As shown in Table 19, replacing about 5% to about 10% by weight of the multifunctional acrylates in the internal phase of the microcapsules with ESBO significantly improves the stability of the Dmax and improves photospeed over a relatively wide temperature range, between room temperature and −26° C. The control imaging sheet showed a decrease of 14.7% to 16.7% in Dmax and an increase of 82.1% to 89.2% in $E_{90}$, indicating a decrease in both color density and photospeed after the low-temperature conditioning. However, incorporating about 5% to about 10% of non-photopolymerizable ESBO into the internal phase of the photosensitive microcapsules decreased the Dmax by only 5.4% to 8.7% and increased the $E_{90}$ by only about 2.7% to 58.10%.

Without being bound to any particular theory, the observed improvements in exposure latitude at low temperature realized by incorporation of multifunctional epoxide (e.g., ESBO) may be attributed to improved solubility of the leuco dye in the internal phase and/or viscosity reduction in the internal phase at low temperature, particularly at sub-zero temperatures.

The compositions and methods illustratively described herein may suitably be practiced in the absence of any element or elements, limitation or limitations, not specifically disclosed herein. Thus, for example, the terms "comprising", "including," containing", etc. shall be read expansively and without limitation. Additionally, the terms and expressions employed herein have been used as terms of description and not of limitation, and there is no intention in the use of such terms and expressions of excluding any equivalents of the features shown and described or portions thereof. It is recognized that various modifications are possible within the scope of the disclosure claimed. Thus, it should be understood that although the present disclosure has been specifically disclosed by preferred embodiments and optional features, modification and variation of the disclosure embodied therein herein disclosed may be resorted to by those skilled in the art, and that such modifications and variations are considered to be within the scope of this disclosure.

Unless the context indicates otherwise, it is specifically intended that the various features of the invention described herein can be used in any combination. Moreover, the disclosure also contemplates that in some embodiments, any feature or combination of features set forth herein can be excluded or omitted. To illustrate, if the specification states that an imaging sheet comprises components A, B and C, it is specifically intended that any of A, B or C, or a combination thereof, can be omitted and disclaimed singularly or in any combination.

The disclosure has been described broadly and generically herein. Each of the narrower species and subgeneric groupings falling within the generic disclosure also form part of the compositions or methods. This includes the generic description of the compositions or methods with a proviso or negative limitation removing any subject matter from the genus, regardless of whether or not the excised material is specifically recited herein. The present technology is not to be limited in terms of the particular embodiments described in this application, which are intended as representative illustrations of individual aspects of the present technology. Many modifications and variations of this present technology can be made without departing from its spirit and scope, as will be apparent to those skilled in the art. Functionally equivalent compositions, methods, and devices within the scope of the present technology, in addition to those enumerated herein, will be apparent to those skilled in the art from the foregoing descriptions. Such modifications and variations are intended to fall within the scope of the present technology. It is to be understood that this present technology is not limited to particular methods, reagents, compounds or compositions, which can, of course, vary. It is also to be understood that the terminology used herein is for the purpose of describing particular embodiments only, and is not intended to be limiting.

One skilled in the art readily appreciates that the present disclosure is well adapted to carry out the objects and obtain the ends and advantages mentioned, as well as those inherent therein. Modifications therein and other uses will occur to those skilled in the art. These modifications are encompassed within the spirit of the disclosure and are defined by the scope of the claims, which set forth non-limiting embodiments of the disclosure.

In addition, where features or aspects of the disclosure are described in terms of Markush groups, those skilled in the art will recognize that the disclosure is also thereby described in terms of any individual member or subgroup of members of the Markush group.

What is claimed is:

1. A photosensitive microcapsule for a microcapsule imaging sheet, comprising:
   a polymeric shell; and
   an internal phase, comprising:
      a leuco dye;
      an epoxide diluent that is non-photopolymerizable by radical initiators, wherein the epoxide diluent is configured to react with a leuco dye developer selected from novolac resins, phenolic resins, and salicylic acid resins;
      a radical photoinitiator; and
      a polymerizable or crosslinkable monomer or oligomer, wherein the epoxide diluent does not react with any photoinitiator or polymerizable or crosslinkable monomer or oligomer in the internal phase.

2. The photosensitive microcapsule of claim 1, wherein the leuco dye developer comprises a Lewis acid, an acid clay, or one or more compounds comprising a phenol group or carboxylic acid group, or metal complexes thereof.

3. The photosensitive microcapsule of claim 1, wherein the leuco dye developer comprises a novolac resin, a salicylic acid derivative, a zincate derivative of a novolac resin or of a salicylic acid derivative, or a combination, copolymer, blend, or composite thereof.

4. The photosensitive microcapsule of claim 1, wherein the epoxide diluent comprises a di-epoxide or tri-epoxide compound.

5. The photosensitive microcapsule of claim 1, wherein the epoxide diluent is present at a concentration of about 3 wt. % to about 20 wt. %, relative to a total weight of the internal phase.

6. The photosensitive microcapsule of claim 1, wherein the polymerizable or crosslinkable monomer comprises a multifunctional acrylate.

7. An imaging sheet, comprising:
   a microcapsule comprising:
      a polymeric shell; and
      an internal phase comprising:
         a leuco dye;
         an epoxide diluent that is non-photopolymerizable by radical initiators, wherein the epoxide diluent is configured to react with a leuco dye developer selected from novolac resins, phenolic resins, and salicylic acid resins;
         a radical photoinitiator; and
         a polymerizable or crosslinkable monomer or oligomer,
      wherein the epoxide diluent does not react with any photoinitiator or the polymerizable or crosslinkable monomer or oligomer in the internal phase;
   a first substrate in contact with the microcapsule; and
   a leuco dye developer.

8. The imaging sheet of claim 7, wherein the leuco dye developer comprises a Lewis acid or an acid clay or one or more compounds having phenol groups or carboxylic acid groups.

9. The imaging sheet of claim 7, further comprising a second substrate in contact with the leuco dye developer, wherein one of the first and second substrates is opaque.

10. The imaging sheet of claim 7, wherein the first substrate further comprises a primer layer in contact with the microcapsule.

11. The imaging sheet of claim 10, wherein the primer layer comprises a particulate selected from the group consisting of: $CaCO_3$, $CaSO_4$, $BaSO_4$, silica, BN, $TiO_2$, $Al_2O_3$, $Ca_3(PO_4)_2$, hydrophobic-treated derivatives thereof, and any combination thereof.

12. An imaging sheet, comprising:
   a diluent microcapsule comprising:
      a polymeric shell; and
      an internal phase comprising an epoxide diluent that is configured to react with a leuco dye developer selected from novolac resins, phenolic resins, and salicylic acid resins; and
   a photosensitive microcapsule, comprising:
      a polymeric shell; and
      an internal phase, comprising:
         a leuco dye;
         a radical photoinitiator; and
         a polymerizable or crosslinkable monomer or oligomer, wherein the epoxide diluent does not react with any photoinitiator or polymerizable or crosslinkable monomer or oligomer in the internal phase of the photosensitive microcapsule;

a first substrate in contact with the diluent microcapsule and the photosensitive microcapsule; and a leuco dye developer.

13. The imaging sheet of claim 12, wherein the leuco dye developer comprises a Lewis acid, an acid clay, or one or more compounds having phenol groups or carboxylic acid groups.

14. The imaging sheet of claim 12, wherein the epoxide diluent comprises a di-epoxide or tri-epoxide compound.

15. The imaging sheet of claim 12, wherein the epoxide diluent is present at a concentration of about 50 wt. % to about 100 wt. %, relative to a total weight of the internal phase.

16. The imaging sheet of claim 12, further comprising a second substrate in contact with the leuco dye developer, wherein one of the first and the second substrates is opaque.

17. The imaging sheet of claim 12, wherein the first substrate further comprises a primer layer in contact with the microcapsule.

18. The imaging sheet of claim 17, wherein the primer layer comprises a particulate selected from the group consisting of: $CaCO_3$, $CaSO_4$, $BaSO_4$, silica, BN, $TiO_2$, $Al_2O_3$, $Ca_3(PO_4)_2$, hydrophobic-treated derivatives thereof, and any combination thereof.

19. The imaging sheet of claim 12, wherein the internal phase of the photosensitive microcapsule further comprises a non-photopolymerizable diluent configured to react with a leuco dye developer, wherein the non-photopolymerizable diluent in the internal phase of the photosensitive microcapsule comprises a di-epoxide or tri-epoxide compound.

20. The imaging sheet of claim 12, wherein the polymerizable or crosslinkable monomer or oligomer comprises a multifunctional acrylate.

21. The imaging sheet of claim 12, wherein the epoxide diluent is non-photopolymerizable by radical initiators.

* * * * *